United States Patent
Lim et al.

(10) Patent No.: US 11,980,028 B2
(45) Date of Patent: May 7, 2024

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Geunwon Lim, Yongin-si (KR); Minjun Kang, Hwaseong-si (KR); Byunggon Park, Seoul (KR); Joongshik Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 318 days.

(21) Appl. No.: 17/343,330

(22) Filed: Jun. 9, 2021

(65) Prior Publication Data
US 2022/0077167 A1 Mar. 10, 2022

(30) Foreign Application Priority Data
Sep. 8, 2020 (KR) .......................... 10-2020-0114687

(51) Int. Cl.
| | |
|---|---|
| H10B 43/27 | (2023.01) |
| G11C 7/18 | (2006.01) |
| H01L 23/528 | (2006.01) |
| H10B 41/10 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC .............. *H10B 41/40* (2023.02); *G11C 7/18* (2013.01); *H01L 23/5283* (2013.01); *H10B 41/10* (2023.02); *H10B 41/27* (2023.02); *H10B 43/10* (2023.02); *H10B 43/27* (2023.02); *H10B 43/40* (2023.02)

(58) Field of Classification Search
CPC ................................ H10B 43/27; H10B 43/20
See application file for complete search history.

(56) References Cited

U.S. PATENT DOCUMENTS

| | | |
|---|---|---|
| 9,117,923 B2 | 8/2015 | Shim et al. |
| 9,768,018 B2 | 9/2017 | Seo et al. |
| 10,381,371 B2 | 9/2019 | Ogawa et al. |

(Continued)

FOREIGN PATENT DOCUMENTS

KR  1020190118751 A  10/2019

*Primary Examiner* — Christopher A Johnson
(74) *Attorney, Agent, or Firm* — Fish & Richardson P.C.

(57) ABSTRACT

A semiconductor includes a lower structure and a stack structure having interlayer insulating layers and horizontal layers alternately stacked on the lower structure. A first dam vertical structure penetrates the stack structure. The first dam vertical structure divides the stack structure into a gate stack region and an insulator stack region. The horizontal layers include gate horizontal layers in the gate stack region and insulating horizontal layers in the insulator stack region. A memory vertical structure and a supporter vertical structure penetrate the gate stack region. Separation structures penetrate the gate stack region. One separation structure includes a first side surface, a second side surface not perpendicular to the first side surface, and a connection side surface extending from the first side surface to the second side surface. The connection side surface is higher than an uppermost gate horizontal layer of the gate horizontal layers.

20 Claims, 24 Drawing Sheets

(56) References Cited

U.S. PATENT DOCUMENTS

| | | |
|---|---|---|
| 10,622,369 B2 | 4/2020 | Zhou et al. |
| 10,636,806 B2 | 4/2020 | Lee |
| 2002/0119598 A1 | 8/2002 | Kawata et al. |
| 2019/0043879 A1* | 2/2019 | Lu .................... H10B 43/50 |
| 2019/0319038 A1 | 10/2019 | Zhang |
| 2020/0043830 A1 | 2/2020 | Baek |
| 2020/0098782 A1* | 3/2020 | Nojima ............... H10B 43/27 |
| 2020/0303397 A1* | 9/2020 | Cui .................... H10B 43/50 |

* cited by examiner

SEMICONDUCTOR DEVICE AND DATA STORAGE SYSTEM INCLUDING THE SAME

CROSS-REFERENCE TO RELATED APPLICATION(S)

This application claims benefit of priority to Korean Patent Application No. 10-2020-0114687 filed on Sep. 8, 2020 in the Korean Intellectual Property Office, the disclosure of which is incorporated herein by reference in its entirety.

BACKGROUND

Example embodiments of the present disclosure relate to a semiconductor device and a data storage system including the same.

There has been demand for a semiconductor device for storing high-capacity data in an electronic system requiring data storage. Accordingly, there have been studies into measures for increasing the data storage capacity of a semiconductor device. For example, as one method for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device improving integration density and reliability.

An example embodiment of the present disclosure is to provide an electronic system including a semiconductor device.

According to an example embodiment of the present disclosure, a semiconductor device includes a lower structure including a peripheral circuit; a stack structure including interlayer insulating layers and horizontal layers alternately stacked on the lower structure, wherein the stack structure is disposed in a memory cell region and a staircase region adjacent to the memory cell region, and the stack structure has a staircase shape in the staircase region; a capping insulating structure covering the stack structure on the lower structure; a first dam vertical structure penetrating the stack structure in the staircase region and extending into the capping insulating structure, wherein the first dam vertical structure divides the stack structure into a gate stack region and an insulator stack region, and among the horizontal layers, horizontal layers disposed in the gate stack region are gate horizontal layers, and horizontal layers disposed in the insulator stack region are insulating horizontal layers; a memory vertical structure penetrating the gate stack region in the memory cell region; a supporter vertical structure penetrating the gate stack region and extending into the capping insulating structure in the staircase region; and a plurality of separation structures penetrating the gate stack region and extending into the capping insulating structure, wherein at least one of the separation structures includes a first side surface, a second side surface not aligned perpendicularly to the first side surface, and a connection side surface extending from the first side surface to the second side surface, and wherein the at least one connection side surface of the separation structures is disposed on a level higher than a level of an uppermost gate horizontal layer of the gate horizontal layers of the stack structure.

According to an example embodiment of the present disclosure, a semiconductor device includes a lower structure; a stack structure including interlayer insulating layers and horizontal layers alternately stacked on the lower structure, wherein the stack structure is disposed in a memory cell region and a staircase region adjacent to the memory cell region, the stack structure has a staircase shape in the staircase region, and the stack structure includes a gate stack region and an insulator stack region; a capping insulating structure covering the stack structure on the lower structure; a memory vertical structure penetrating the gate stack region in the memory cell region; a supporter vertical structure penetrating the gate stack region and extending into the capping insulating structure in the staircase region; a dam vertical structure penetrating a region between the gate stack region and the insulator stack region of the stack structure; and a plurality of separation structures penetrating the gate stack region and extending into the capping insulating structure, wherein the memory vertical structure, the supporter vertical structure, and the dam vertical structure have upper surfaces coplanar with one another, wherein the separation structures include a first separation structure, wherein the first separation structure includes a separation gap-fill material layer and a void in the separation gap-fill material layer, wherein each of the memory vertical structure, the supporter vertical structure, and the dam vertical structure includes a gap-fill insulating layer; a channel material layer covering an external surface and a bottom surface of the gap-fill insulating layer; a first dielectric layer covering an external surface and a bottom surface of the channel material layer; a data storage material layer covering an external surface and a bottom surface of the first dielectric layer; a second dielectric layer covering an external surface and a bottom surface of the data storage material layer; and a pad material layer on the gap-fill insulating layer, wherein at least one of the memory vertical structure, the supporter vertical structure, and the dam vertical structure includes a void, and wherein a maximum width of the void in the separation gap-fill material layer is greater than a maximum width of the void of the gap-fill insulating layer of at least one of the memory vertical structure, the supporter vertical structure, and the dam vertical structure.

According to an example embodiment of the present disclosure, a data storage system includes a main substrate; a semiconductor device on the main substrate; and a controller electrically connected to the semiconductor device on the main substrate, wherein the semiconductor device includes: a lower structure including a peripheral circuit; a stack structure including interlayer insulating layers and horizontal layers alternately stacked on the lower structure, wherein the stack structure is disposed in a memory cell region and a staircase region adjacent to the memory cell region, and the stack structure has a staircase shape in the staircase region; a capping insulating structure covering the stack structure on the lower structure; a dam vertical structure penetrating the stack structure in the staircase region and extending into the capping insulating structure, wherein the dam vertical structure divides the stack structure into a gate stack region and an insulator stack region, and among the horizontal layers, horizontal layers disposed in the gate stack region are gate horizontal layers, and horizontal layers disposed in the insulator stack region are insulating horizontal layers; a memory vertical structure penetrating the gate stack region in the memory cell region; a supporter vertical structure penetrating the gate stack region and extending into the capping insulating structure in the staircase region; a plurality of separation structures penetrating the gate stack region and extending into the capping insulating structure, wherein at least one of the separation structures includes a first side surface, a second side surface not aligned perpendicularly to the first side surface, and a connection side surface extending from the first side surface to the second side surface, and wherein the at least one connection side surface of the separation structures is disposed on a level higher than a level of an uppermost gate horizontal layer of the gate horizontal layers of the stack structure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

A semiconductor device in the example embodiment will be described with reference to FIGS. 1A to 2B. With respect to FIGS. 1A to 2B, FIG. 1A is a plan diagram illustrating a semiconductor device according to an example embodiment. FIG. 1B is an enlarged plan diagram illustrating portion "A" illustrated in FIG. 1A. FIG. 2A is a cross-sectional diagram taken long line I-I' in FIGS. 1A and 1B. FIG. 2B is a cross-sectional diagram taken long line II-II' in FIG. 1B.

Figure 1A:
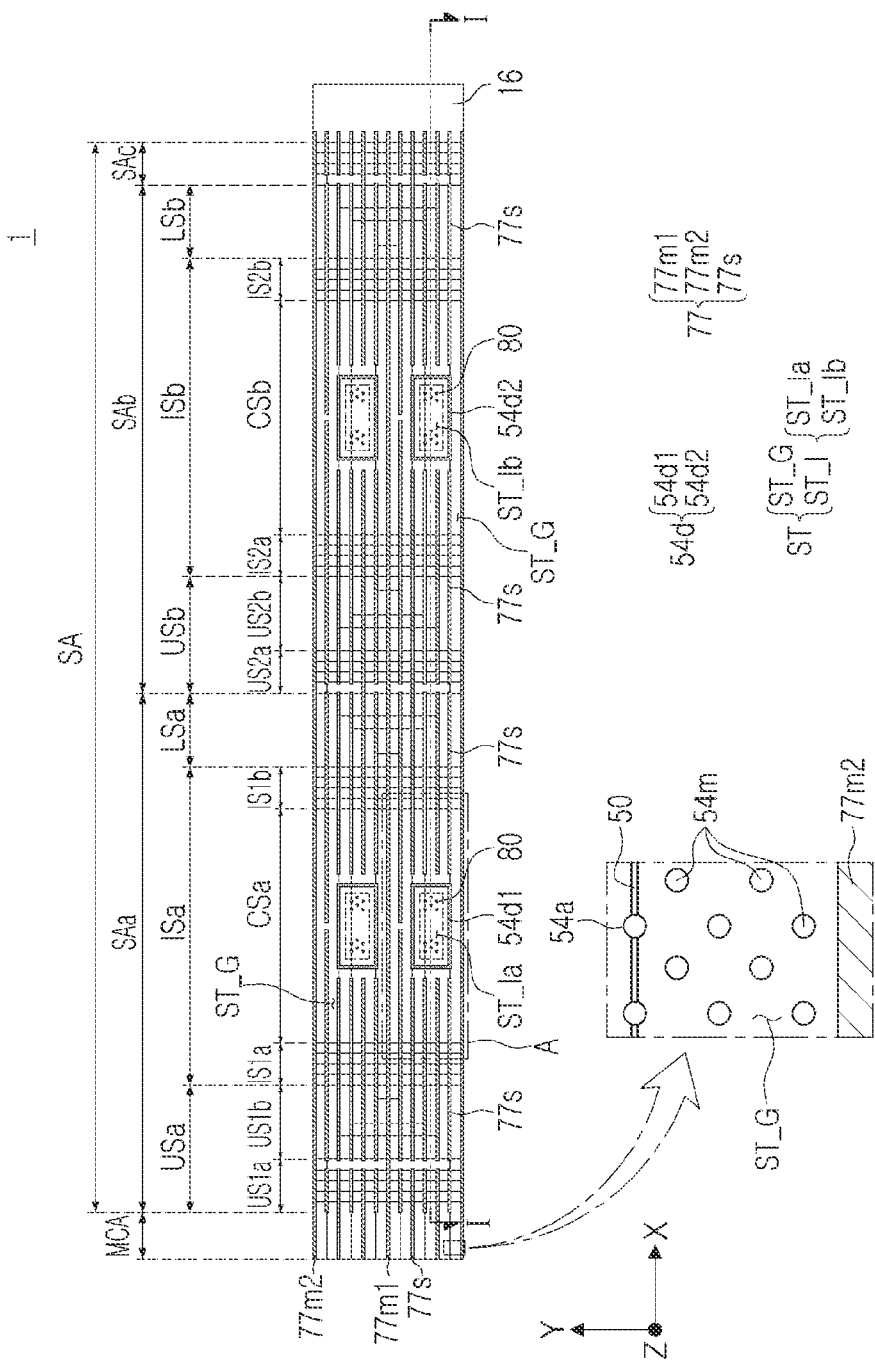
FIGS. 1A to 2B are cross-sectional diagrams illustrating a semiconductor device according to an example embodiment of the present disclosure.
Figure 1B:
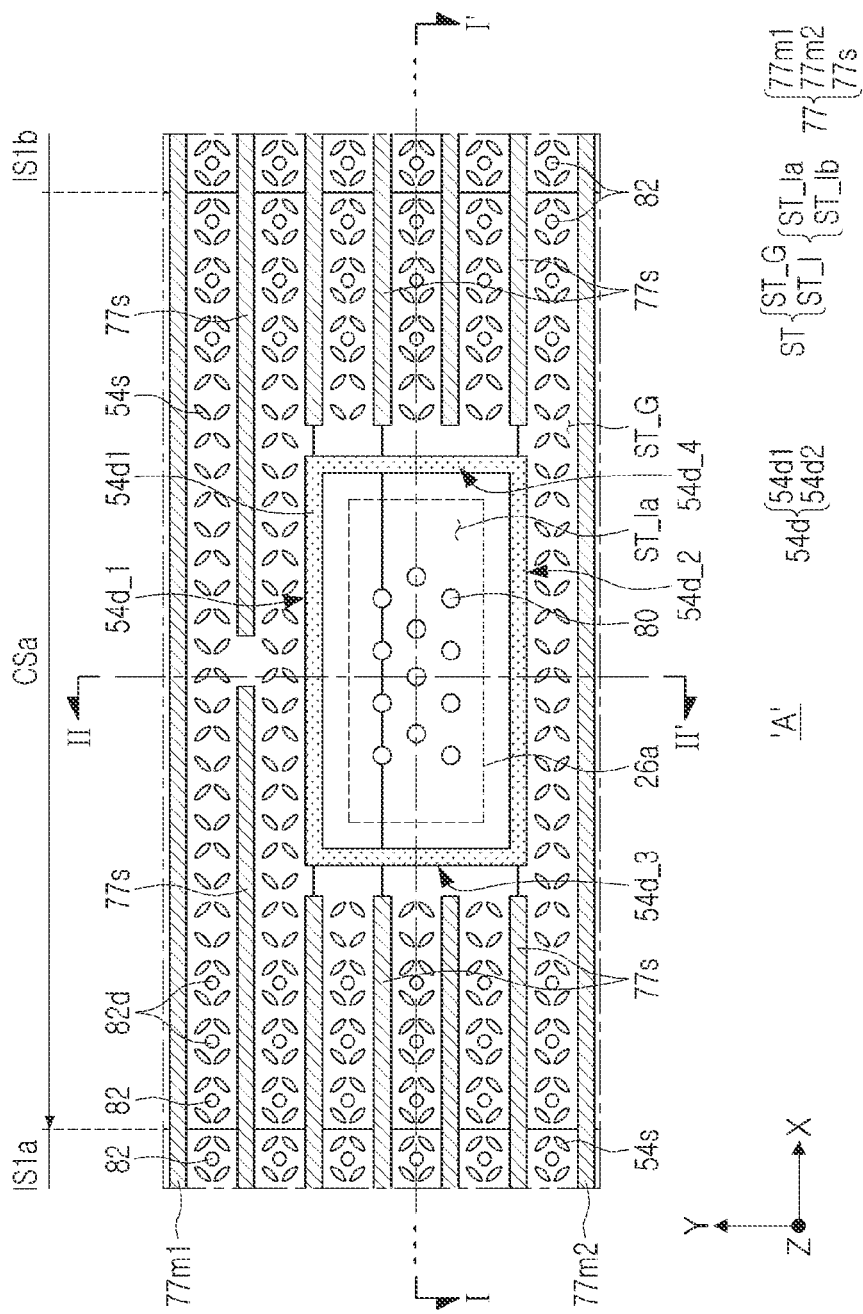
Figure 2A:
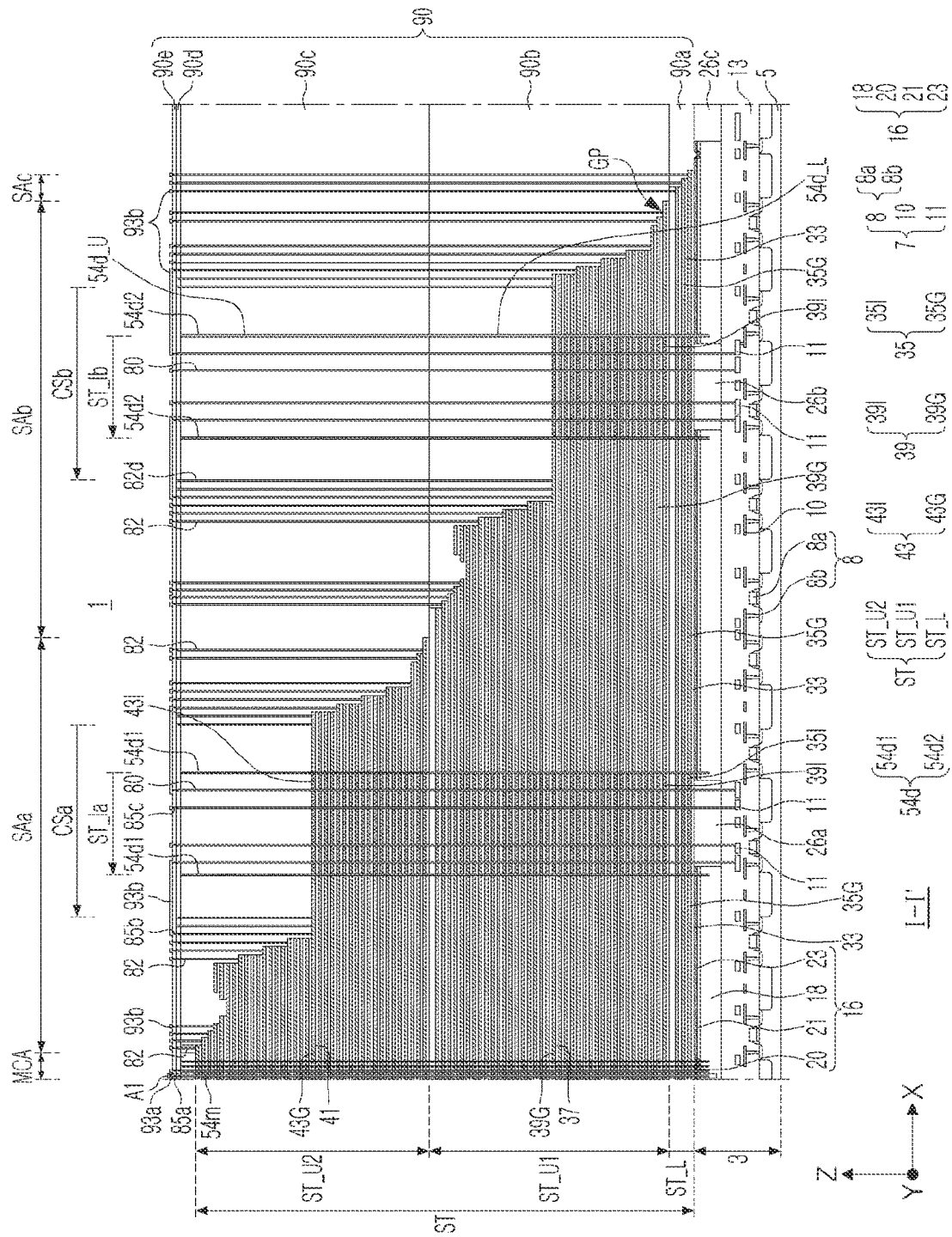
Figure 2B:
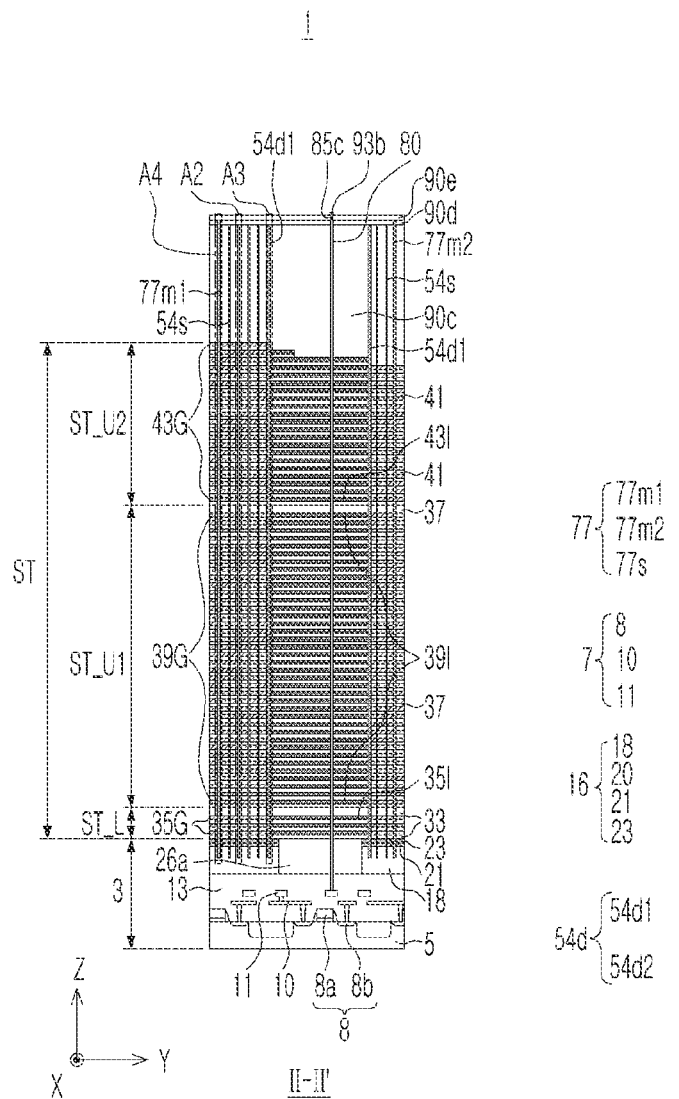

Referring primarily to FIG. 2A and secondarily to FIGS. 1A, 1B and 2B, a semiconductor device 1 in the example embodiment may include a lower structure 3, a stack structure ST, a capping insulating structure 90, a plurality of memory vertical structures 54m, a plurality of dam vertical structures 54d, a plurality of supporter vertical structures 54s (see FIG. 2A), a plurality of separation structures 77, and a plurality of through contact plugs 80 (see FIG. 2A).

The lower structure 3 may include a peripheral circuit 7. For example, the lower structure 3 may include a semiconductor substrate 5, a peripheral transistor 8 on the semiconductor substrate 5, a peripheral wiring 10 electrically connected to the peripheral transistor 8, peripheral pads 11 electrically connected to the peripheral wiring 10, and a lower insulating layer 13 covering the peripheral transistor 8, the peripheral wiring 10, and the peripheral pads 11 on the semiconductor substrate 5. The peripheral transistor 8, the peripheral wiring 10, and the peripheral pads 11 may form the peripheral circuit 7.

The lower structure 3 may further include a pattern structure 16. For example, the pattern structure 16 may include a lower pattern layer 18, a first intermediate pattern layer 20 and a second intermediate pattern layer 21 spaced apart from each other on the lower pattern layer 18, and an upper pattern layer 23 covering the first and second intermediate pattern layers 20a and 21 on the lower pattern layer 18.

In an example, the lower pattern layer 18 may include a first polysilicon, the first intermediate pattern layer 20 may include a second polysilicon, and the upper pattern layer 23 may include a third polysilicon. For example, the lower pattern layer 18, the first intermediate pattern layer 20, and the upper pattern layer 23 may include polysilicon having N-type conductivity.

In an example, the upper pattern layer 23 may be in contact with the lower pattern layer 18 between the first and second intermediate pattern layers 20 and 21 and may penetrate a portion of the second intermediate pattern layer and may be in contact with the lower pattern layer 22.

In an example, the second intermediate pattern layer 21 may include an insulating material layer. For example, the second intermediate pattern layer 21 may include a silicon nitride layer and a silicon oxide layer covering upper and lower surfaces of the silicon nitride layer. In another example, the second intermediate pattern layer 21 may include a polysilicon layer and a silicon oxide layer covering upper and lower surfaces of the polysilicon layer.

In an example, the lower structure 3 may further include first intermediate insulating layers 26a and second intermediate insulating layers 26b penetrating the pattern structure 16, and an external insulating layer 26c on an external surface of the pattern structure 16. The first and second intermediate insulating layers 26a and 26b and the external insulating layer 26c may include silicon oxide.

The stack structure ST may include interlayer insulating layers 33, 39 and 41 and horizontal layers 35, 39 and 43 alternately stacked on the lower structure 3.

The interlayer insulating layers 33, 39, and 41 and the horizontal layers 35, 39, and 43 may be alternately stacked in the first region MCA of the stack structure ST, may extend from the first region MCA to the second region SA (see FIG. 1A) of the stack structure ST, and may have a staircase shape in the second region SA. Accordingly, the stack structure ST may have a staircase shape in the second region SA.

In example embodiments, the first region MCA may be referred to as a memory cell region or a memory cell array region and the second region SA may be referred to as a staircase region, an extended region, a connection region, or a contact region.

The stack structure ST may include a lower stack structure ST_L, a first stack structure ST_U1 on the lower stack structure ST_L, and a second stack structure ST_U2 on the first stack structure ST_U1.

The lower stack structure ST_L may include lower interlayer insulating layers 33 and lower horizontal layers 35 alternately stacked. Among the lower interlayer insulating layers 33 and the lower horizontal layers 35, a lowermost layer and an uppermost layer may be lower interlayer insulating layers. In an example, among the lower interlayer insulating layers 33, an uppermost lower interlayer insulating layer may have a thickness greater than a thickness of each of the other lower interlayer insulating layers.

The first stack structure ST_U1 may include first interlayer insulating layers 37 and first horizontal layers 39 alternately stacked. Among the first interlayer insulating layers 37 and the first horizontal layers 39, a lowermost layer and an uppermost layer may be first interlayer insulating layers. In an example, among the first interlayer insulating layers 37, an uppermost first interlayer insulating layer may have a thickness greater than a thickness of each of the other first interlayer insulating layers.

The second stack structure ST_U2 may include second interlayer insulating layers 41 and second horizontal layers 43 alternately stacked. Among the second interlayer insulating layers 41 and the second horizontal layers 43, a lowermost layer and an uppermost layer may be second interlayer insulating layers. In an example, among the second interlayer insulating layers 41, an uppermost second interlayer insulating layer may have a thickness greater than a thickness of each of the other second interlayer insulating layers.

In an example, the staircase region SA of the stack structure ST may include a staircase region SAa of the second stack structure ST_U2, a staircase region SAb of the first stack structure ST_U1, and a staircase region SAc of the lower stack structure ST_L arranged in order in a direction towards the staircase region SA from the memory cell region MCA, a first direction X, for example.

The staircase region SAc of the lower stack structure ST_L may have a staircase shape sequentially lowered by a first height difference in the first direction X.

In the staircase region SA, the first and second stack structures ST_U1 and ST_U2 may have substantially the same planar staircase shape or similar planar staircase shapes. For example, in the staircase region SA, the first and second stack structures ST_U1 and ST_U2 may include upper staircase regions USa and USb, intermediate staircase regions ISa and ISb, and lower staircase regions LSa and LSb, sequentially arranged in the first direction X, respectively (see FIG. 1A).

In each of the first and second stack structures ST_U1 and ST_U2, the upper staircase regions USa and USb may include first upper staircase regions US1a and US2a having a staircase shape lowered by the first height different in the first direction X and second upper staircase regions US1b and US2b including a staircase shape increasing by a first height difference in the first direction X from the first upper staircase regions US1a and US2a (see FIG. 1A).

In each of the first and second stack structures ST_U1 and ST_U2, the lower staircase regions LSa and LSb may have a staircase shape sequentially lowered by the first height difference in the first direction X.

In each of the first and second stack structures ST_U1 and ST_U2, the intermediate staircase regions ISa and ISb may include first intermediate staircase regions IS1a and IS2a, staircase connection regions CSa and CSb, and second intermediate staircase regions IS1b and IS2b, sequentially arranged in the first direction X.

In each of the first and second stack structures ST_U1 and ST_U2, the first intermediate staircase regions IS1a and IS2a may have upper surfaces disposed on a level higher than a level of the second intermediate staircase regions IS1b and IS2b.

The first intermediate staircase region IS1a and IS2a and the second intermediate staircase region IS1b and IS2b may have a staircase shape lowered by a second height difference greater than the first height difference in the first direction X. The first intermediate staircase regions IS1a and IS2a and the second intermediate staircase regions IS1b and IS2b may have a staircase shape lowered or increasing by the first height difference in a second direction Y perpendicular to the first direction X.

In each of the first and second stack structures ST_U1 and ST_U2, the staircase connection regions CSa and CSb may have a staircase shape substantially planar in the first direction X, and lowered or increasing by the first height difference in the second direction Y.

In the stack structure ST, the horizontal layers 35, 39, and 43 may include gate horizontal layers 35G, 39G, and 43G and insulating horizontal layers 35I, 39I, and 43I. For example, at one level, one of the horizontal layers may include one of the gate horizontal layers and at least one of the insulating horizontal layers spaced apart from the one of the gate horizontal layer.

In the stack structure ST, a region in which the gate horizontal layers 35G, 39G, and 43G are disposed may be defined as a gate stack region ST_G (see FIG. 1A) and a region in which the insulating horizontal layers 35I, 39I, and 43I are disposed may be defined as an insulator stack region ST_I. The interlayer insulating layers 33, 37, and 41 may be formed of silicon oxide, and the insulating horizontal layers 35I, 39I, and 43I may be formed of an insulating material different from a material of the interlayer insulating layers 33, 37, 41, silicon nitride, for example.

In the staircase region SA of the stack structure ST, the gate horizontal layers 35G, 39G, and 43G may have gate pad regions GP. The gate pad regions GP may be defined as regions of which upper portions are not covered by another gate horizontal layer.

In the staircase region SA, a plurality of the insulator stack regions ST_I may be disposed. For example, the plurality of insulator stack regions ST_I may include a first insulator stack region ST_Ia and a second insulator stack region ST_Ib disposed in order in the first direction X and spaced apart from each other.

In an example, the first insulator stack region ST_Ia may be disposed in the lower stack structure ST_L, the first stack structure ST_U1, and the second stack structure ST_U2 and the second insulator stack region ST_Ib may be disposed in the lower stack structure ST_L and the first stack structure ST_U1.

In the lower stack structure ST_L, the lower insulating horizontal layers 35I may include lower insulating horizontal layers 35Ia disposed in the first insulator stack region ST_Ia and lower insulating horizontal layers 35Ib disposed in the second insulator stack region ST_Ib. Accordingly, one of the lower horizontal layers 35 may include one of the gate horizontal layers 35G and a plurality of insulating horizontal layers 35Ia and 35Ib connected to the one of the gate horizontal layers 35G.

In the first stack structure ST_U1, the first insulating horizontal layers 39I may include first insulating horizontal layers 39Ia disposed in the first insulator stack region ST_Ia, and first insulating horizontal layers 39Ib disposed in the second insulator stack region ST_Ib.

In the second stack structure ST_U2, the second insulating horizontal layers 43I may be disposed in the first insulator stack region ST_Ia.

The capping insulating structure 90 may cover the stack structure ST on the lower structure 3. The capping insulating structure 90 may include a first capping insulating layer 90a, a second capping insulating layer 90b, a third capping insulating layer 90c, a fourth capping insulating layer 90d, and a fifth capping insulating layer 90e. The capping insulating structure 90 may be formed of an insulating material such as silicon oxide. For example, the first to fifth capping insulating layers 90a, 90b, 90c, 90d, and 90e may be formed of silicon oxide.

The first capping insulating layer 90a may cover a region of the lower structure 3 which does not overlap the stack structure ST, may cover the staircase region SAc of the lower stack structure ST_L, and may have an upper surface coplanar with an upper surface of the lower stack structure ST_L. The second capping insulating layer 90b may cover the first capping insulating layer 90a and the staircase region SAb of the first stack structure ST_U1, and may have an upper surface coplanar with an upper surface of the first stack structure ST_U1. The third capping insulating layer 90c may cover the second capping insulating layer 90b and the staircase region SAa of the second stack structure ST_U2, and may have an upper surface coplanar with an upper surface of the second stack structure ST_U2. The fourth capping insulating layer 90d and the fifth capping insulating layer 90e may be stacked in order on the upper surfaces of the third capping insulating layer 90c and the second stack structure ST_U2.

The plurality of memory vertical structures 54m may penetrate the memory cell region MCA of the stack structure ST. The memory vertical structures 54m may be in contact with the pattern structure 16. The memory vertical structures 54m may penetrate the gate horizontal layers 35G, 39G, and 43G of the gate stack region ST_G.

The plurality of supporter vertical structures 54s (see FIG. 1B) may penetrate the staircase region SA of the stack structure ST and may extend into the capping insulating structure 90. The plurality of supporter vertical structures 54s may penetrate the gate horizontal layers 35G, 39G, and 43G of the gate stack region ST_G of the stack structure ST. The plurality of supporter vertical structures 54s may be in contact with the pattern structure 16.

In an example, at least a portion of the plurality of supporter vertical structures 54s may have an oval shape having a major axis and a minor axis. For example, one of the supporter vertical structures 54s may have a length in a major axis direction and a width in a minor axis direction. The length of the supporter vertical structure 54s in the major axis direction may be greater than a width of each of the memory vertical structures 54m. A width of the supporter vertical structure 54s in the minor axis direction may be substantially the same as a width of each of the memory vertical structures 54m.

In another example, at least a portion of the plurality of vertical supporter structures 54s may have a circular shape.

The plurality of dam vertical structures 54d may penetrate the staircase region SA of the stack structure ST and may extend into the capping insulating structure 90. The dam vertical structures 54d may be in contact with the pattern structure 16. The dam vertical structures 54d may separate the plurality of insulator stack regions ST_I from the gate stack region ST_G.

The plurality of dam vertical structures 54d may be disposed between each of the plurality of insulator stack regions ST_I and the gate stack region ST_G. The dam vertical structures 54d may surround the plurality of insulator stack regions ST_I, respectively. For example, the dam vertical structures 54d may include a first dam vertical structure 54d1 surrounding a side surface of the first insulator stack region ST_Ia and a second dam vertical structure 54d2 surrounding a side surface of the second insulator stack region ST_Ib. Accordingly, the dam vertical structures 54d may separate the gate horizontal layers 35G, 39G, and 43G adjacent to each other in a horizontal direction from the insulating horizontal layers 35I, 39I, and 43I.

In an example, each of the dam vertical structures 54d may include a linear portion having a first width. Referring to FIG. 1B, each of the dam vertical structures 54d may include a pair of first and second linear portions 54d_1 and 54d_2 extending in the first direction X and a pair of third and fourth lines 54d_3 and 54d_4 extending in the second direction Y. Ends of the first and second linear portions 54d_1 and 54d_2 and the third and fourth lines 54d_3 and 54d_4 may be connected to each other, thereby having a quadrangular ring shape or a ring shape similar to a quadrangle.

Viewed on a plane, in the dam vertical structures 54d, a pair of the first and second linear portions 54d_1 and 54d_2 extending in the first direction X may be arranged with a portion of the auxiliary separation structures 77s in the first direction X.

In an example, a width of each of the first to fourth linear portions 54d_1, 54d_2, 54d_3, and 54d_4 of the dam vertical structures 54d may be substantially the same as a width of each of the separation structures 77.

In an example, a width of each of the first to fourth linear portions 54d_1, 54d_2, 54d_3, and 54d_4 of the dam vertical structures 54d may be greater than a width of each of the memory vertical structures 54m.

In an example, one of the auxiliary separation structures 77s may extend to a region between the first linear portion 54d_1 and a first main separation structure 77m1 (see FIG. 1B). The second linear portion 54d_2 may have a side surface opposing a second main separation structure 77m2.

The semiconductor device 1 in an example embodiment may further include gate contact plugs 82 in contact with the gate pad regions GP of the gate horizontal layers 35G, 39G, and 43G and extending into the capping insulating structure 90. The gate pad regions GP in contact with the gate contact plugs 82 may be formed of a conductive material.

A portion of the gate contact plugs 82 may be configured as dummy gate contact plugs 82d.

The semiconductor device 1 in the example embodiment may further include a plurality of through contact plugs 80 penetrating the stack structure ST and extending into the capping insulating structure 90. The plurality of through contact plugs 80 may include a plurality of peripheral through plugs penetrating the first insulator stack region ST_I and a plurality of peripheral through plugs penetrating the second insulator stack region ST_Ib. The plurality of through contact plugs 80 may extend in a downward direction from a portion penetrating the stack structure ST, may penetrate the intermediate insulating layers 26a and 26b, and may be electrically connected to the peripheral pads 11 of the peripheral circuit 7.

The semiconductor device 1 in the example embodiment may include bit-line connection patterns 85a electrically connected to the memory vertical structures 54m, gate connection patterns 85b electrically connected to the gate contact plugs 82, and peripheral connection patterns 85c electrically connected to the plurality of through contact plugs 80.

The semiconductor device 1 in the example embodiment may further include bit lines 93a disposed on the bit-line connection patterns 85a.

The semiconductor device 1 in an example embodiment may further include gate connection wirings 93b disposed on the gate connection patterns 85b and the peripheral connection patterns 85c.

The memory vertical structures 54m may be electrically connected to the bit lines 93a. The gate horizontal layers 35G, 39G, and 43G may be electrically connected to the peripheral circuit 7 through the gate contact plugs 82, the gate connection wirings 93b, and the plurality of through contact plugs 80.

Separation structures 77 may be disposed to penetrate the stack structure ST in the vertical direction Z and extend into the capping insulating structure 90. Each of the separation structures 77 may have a linear shape extending in the first direction X.

Referring to FIG. 1A, the separation structures 77 may include first and second separation structures 77m1 and 77m2 dividing the stack structure ST in the second direction Y and parallel to each other.

The separation structures 77 may include auxiliary separation structures 77s disposed between the first and second separation structures 77m1 and 77m2, and penetrating the stack structure ST. Each of the auxiliary separation structures 77s may have a length smaller than the length of the stack structure ST in the first direction X.

The auxiliary separation structures 77s may be disposed in the staircase region SA of the stack structure ST, and at least one of the auxiliary separation structures 77s may extend into the memory cell region MCA of the stack structure ST.

Referring to FIG. 1A, the semiconductor device 1 in an example embodiment may further include upper select gate separation patterns 50 disposed between the separation structures 77 in the memory cell region MCA. The upper select gate separation patterns 50 may separate the gate horizontal layers of the gate horizontal layers 35G, 39G, and 43G, which may be upper select gate lines disposed on a level higher than a level of the gate horizontal layers, which may be word lines in the second direction Y.

Referring to FIG. 1A, the semiconductor device 1 in the example embodiment may further include dummy vertical structures 54a penetrating the upper select gate separation patterns 50. The dummy vertical structures 54a may be formed of a material substantially the same as a material of the memory vertical structures 54m and may have substantially the same size and the same cross-sectional surface as those of the memory vertical structures 54m.

The plurality of memory vertical structures 54m, the plurality of dam vertical structures 54d, and the plurality of supporter vertical structures 54s may have upper surfaces coplanar with one another. For example, the upper surfaces of the plurality of memory vertical structures 54m, the plurality of dam vertical structures 54d, and the plurality of supporter vertical structures 54s may be disposed on the same level. For example, the upper surfaces of the plurality of memory vertical structures 54m, the plurality of dam vertical structures 54d, and the plurality of supporter vertical structures 54s may be disposed below the fourth capping insulating layer 90d. For example, a portion of the upper surface of each of the plurality of memory vertical structures $\vartheta_m$ may be in contact with the fourth capping insulating layer 90d and the other upper surfaces may be in contact with the bit-line connection pattern 85a. The entire upper surfaces of the plurality of dam vertical structures 54d and the plurality of supporter vertical structures 54s may be in contact with the fourth capping insulating layer 90d.

Figure 3A:
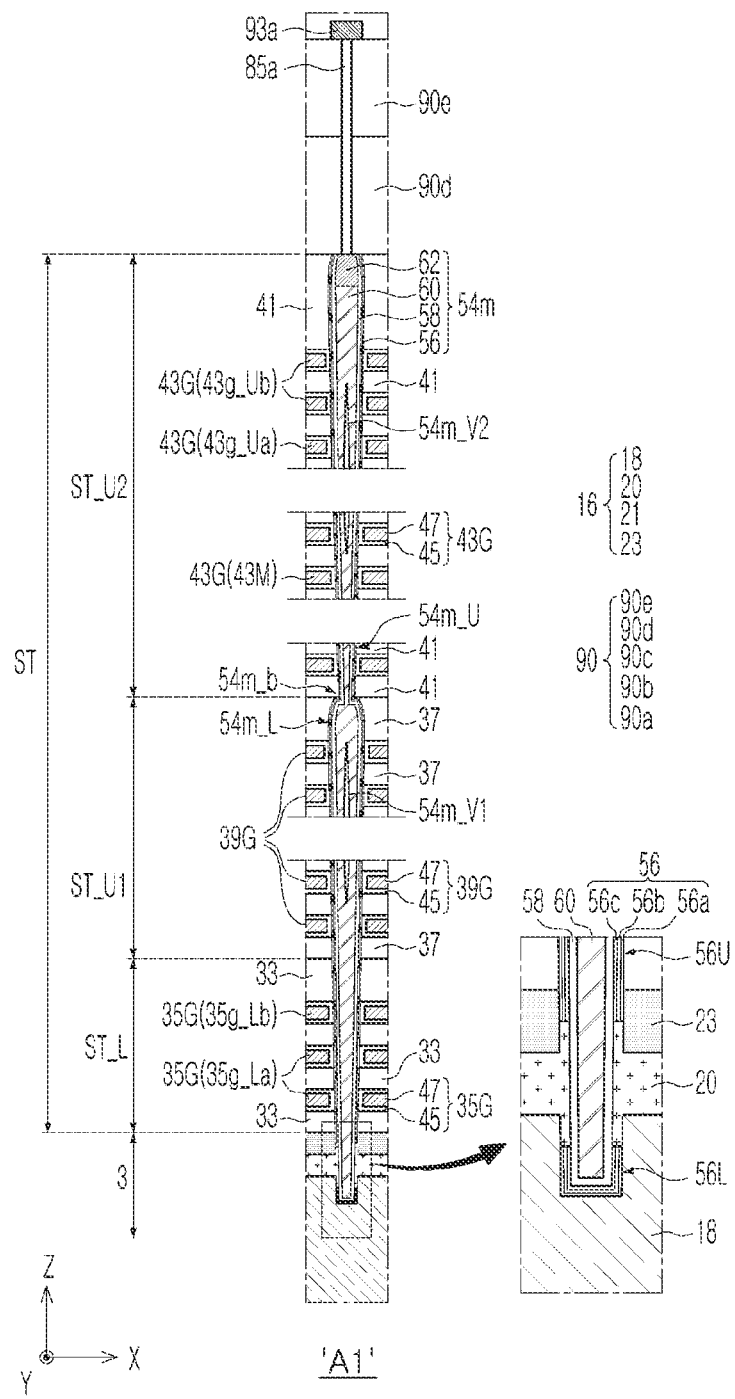
FIGS. 3A to 3D are enlarged cross-sectional diagrams illustrating a portion of elements of a semiconductor device according to an example embodiment of the present disclosure.
Figure 3B:
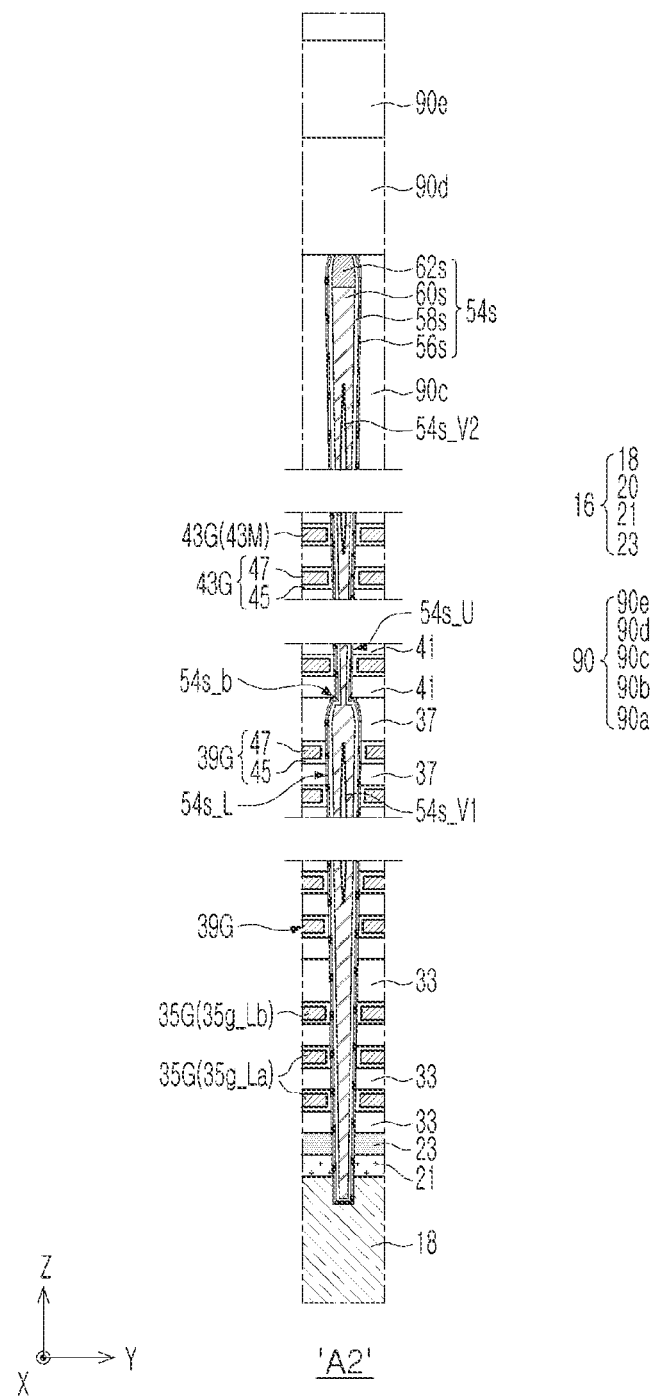
Figure 3C:
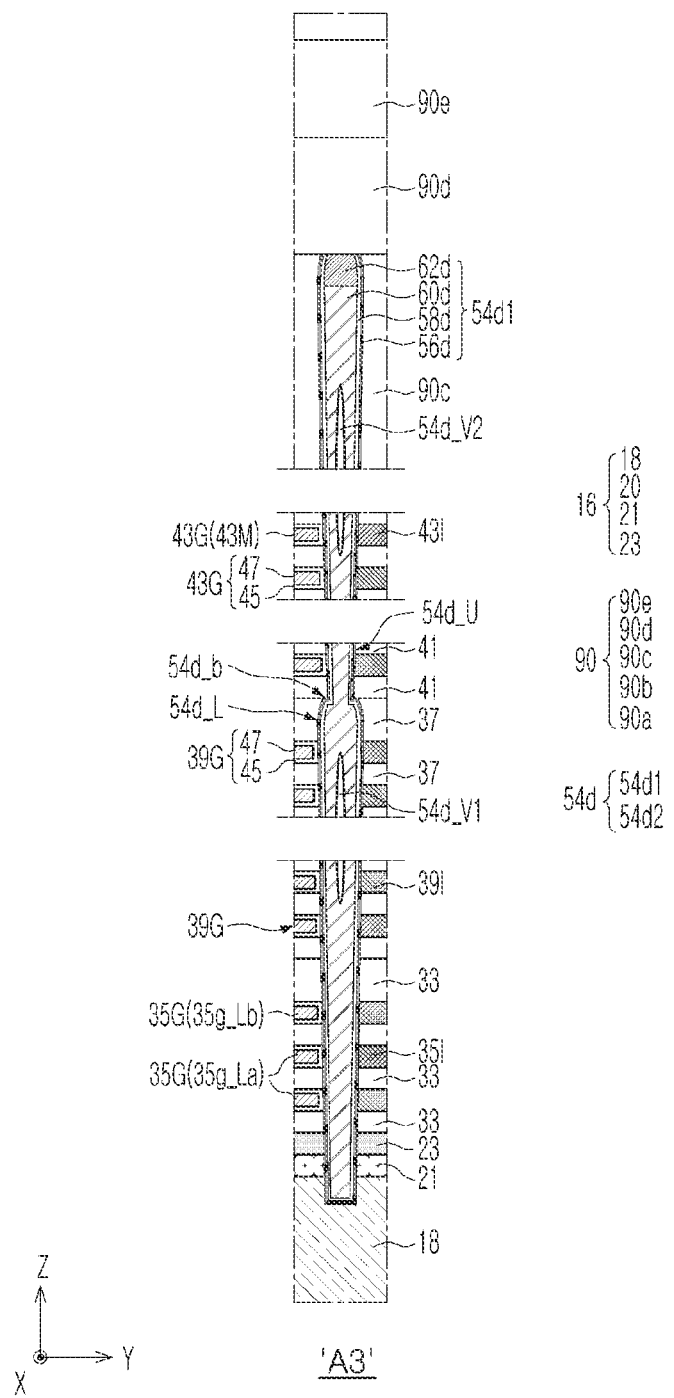

The memory vertical structure 54m (in FIG. 3A) of one of the pattern structures 16, the stack structure ST, and the plurality of memory vertical structures; the supporter vertical structure 54s (in FIG. 3B) of one of the plurality of vertical supporter structures 54s, and the first dam vertical structure 54d1 (in FIG. 3C) of the plurality of dam vertical structures 54d will be described with reference to FIGS. 3A, 3B, and 3C. With regard to FIGS. 3A, 3B, and 3C, FIG. 3A is an enlarged cross-sectional diagram illustrating portion "A1" illustrated in FIG. 2A. FIG. 3B is an enlarged diagram illustrating portion "A2" illustrated in FIG. 2B. FIG. 3C is an enlarged diagram illustrating portion "A3" illustrated in FIG. 2B.

Referring to FIGS. 3A, 3B, and 3C, in the stack structure ST, each of the gate horizontal layers 35G, 39G, and 43G may include a first gate layer 45 and a second gate layer 47. The second gate layer 47 may have one side surface in contact with the separation structures 77, and the first gate layer 45 may cover an upper surface and a lower surface of the second gate layer 47 and may cover side surfaces of the second gate layer 47 which are not in contact with the separation structures 77. For example, the first gate layer 45 may include a portion interposed between the second gate layer 47 and the memory vertical structure 54m.

In an example, the first gate layer 45 may include a dielectric material, and the second gate layer 47 may include a conductive material. For example, the first gate layer 45 may include a high-k dielectric such as AlO, and the second gate layer 47 may include a conductive material such as TiN, WN, Ti, or W.

In another example, the first gate layer 45 may include a first conductive material (e.g., TiN or W, or the like), and the second gate layer 47 may include a second conductive material (e.g., Ti, W, or the like) different from the first conductive material.

In another example, each of the first and second gate layers 45 and 47 may be formed of a doped polysilicon, a metal-semiconductor compound (e.g., TiSi, TaSi, CoSi, NiSi or WSi), a metal nitride (e.g., TiN, TaN or WN) or a metal (e.g., Ti or W).

In an example, among the gate horizontal layers 35G, 39G, and 43G, the lowermost first lower gate horizontal layer 35g_La may be lower erase control gate electrodes, and the second lower gate horizontal layer 35g_Lb on the first lower gate horizontal layer 35g_La may be configured as a lower select gate electrode, a ground select gate electrode, for example. Among the gate horizontal layers 35G, 39G, and 43G, the first upper gate horizontal layer 43g_Ua may be an upper select gate electrode, a string select gate electrode for example, and the second upper horizontal gate layer 43_g_Ub on the first upper horizontal gate layer 43g_Ua may be an upper erase control gate electrode. A single first lower gate horizontal layer 35g_La may be provided or a plurality of first lower gate horizontal layers 35g_La may be stacked in the vertical direction Z, and a single second upper gate horizontal layer 43g_Ub may be provided or a plurality of second upper gate horizontal layer 43_g_Ub may be stacked in the vertical direction Z.

In an example, among the gate horizontal layers 35G, 39G, and 43G, a portion of the gate horizontal layers 39G and 43M disposed between the second lower horizontal gate layer 35g_Lb and the first upper horizontal gate layer 43_g_Ua may be word lines.

The memory vertical structure 54m, the supporter vertical structure 54s, and the dam vertical structure 54d may include the same material layers. For example, the memory vertical structure 54m, the supporter vertical structure 54s, and the dam vertical structure 54d may include gap-fill insulating layers 60, 60s, and 60d, channel material layers 58, 58s, and 58d covering external surfaces and bottom surfaces of the gap-fill insulating layers 60, 60s, and 60d, data storage structures 56, 56s, and 56d covering external surfaces and bottom surfaces of the channel material layers 58, 58s, and 58d, and pad material layers 62, 62s, and 62d on the gap-fill insulating layers 60, 60s, and 60d, respectively.

The data storage structure 56, 56s and 56d may include a first dielectric layer 56c (in FIG. 3A) covering the external and bottom surfaces of the channel material layer 58, 58s, and 58d, a data storage material layer 56b (in FIG. 3A) covering the external and bottom surfaces of the first dielectric layer 56c, and a second dielectric layer 56a (in FIG. 3A) covering the external and bottom surfaces of the data storage material layer 56b (in FIG. 3A). The first dielectric layer 56c may be in contact with the channel material layer 58, and the data storage material layer 56b may be spaced apart from the channel material layer 58.

The gap-fill insulating layers 60, 60s, and 60d may include, for example, silicon oxide, such as atomic layer deposition (ALD) silicon oxide formed by an atomic layer deposition process.

The first dielectric layer 56c may include silicon oxide or silicon oxide doped with impurities. The second dielectric layer 56a may include at least one of silicon oxide and a high-k dielectric material. The data storage material layer 56b may include a material able to trap charges, silicon nitride for example.

The data storage material layer 56b of the data storage structure 56 of the memory vertical structure 54m may include regions for storing data in a semiconductor device such as a flash memory device. The data storage material layer 56b of the data storage structure 56 of the supporter vertical structure 54s and the dam vertical structure 54d may be a dummy which does not store data.

The gap-fill insulating layers 60, 60s, and 60d may include silicon oxide. The channel material layers 58, 58s, and 58d may include polysilicon. The pad material layers 62, 62s, and 62d may include at least one of doped polysilicon, metal nitride (e.g., TiN, or the like), a metal (e.g., W, or the like), and a metal-semiconductor compound (e.g., TiSi, or the like).

In an example, the first intermediate pattern layer 20, which may be formed of a polysilicon layer, may penetrate the data storage structure 56 of the memory vertical structure 54m and may be in contact with the channel material layer 58 of the memory vertical structure 54m. Accordingly, the data storage structure 56 of the memory vertical structure 54m may be divided into a lower portion 56L and an upper portion 56U by the first intermediate pattern layer 20.

In an example, the second intermediate pattern layer 21, which may include an insulating material layer, may be in contact with an external surface of the data storage structure 56 of the supporter vertical structure 54s and the dam vertical structure 54d, and may be spaced apart from the channel material layer 58.

The bit-line connection pattern 85a may be in contact with and electrically connected to the pad material layer 62 of the memory vertical structure 54m.

In FIG. 3A, the memory vertical structure 54m may include a first memory vertical portion 54m_L penetrating the lower stack structure ST_L and the first stack structure ST_U1 and in contact with the lower pattern layer 18 of the pattern structure 16 and a second memory vertical portion 54m_U extending from the first memory vertical portion 54m_L and penetrating the second stack structure ST_U2. A width of an upper region of the first memory vertical portion 54m_L adjacent to the second memory vertical portion 54m_U may be greater than a width of a lower region of the second memory vertical portion 54m_U adjacent to the first memory vertical portion 54m_L. As described above, a portion having a width that varies between the upper region of the first memory vertical portion 54m_L having a relatively large width and the lower region of the second memory vertical portion 54m_U having a relatively small width may be defined as a width variation portion 54m_b. Accordingly, the memory vertical structure 54m may include the width variation portion 54m_b of which a width varies in a region in which the first memory vertical portion 54m_L and the second memory vertical portion 54m_U are adjacent to each other.

In example embodiments, the width variation portion 54m_b may also be referred to as a term such as an inflection portion.

Hereinafter, the term "width variation portion" may refer to a region between an upper region of the lower portion having a relatively large width and a lower region of the upper portion having a relatively small width, similarly to the width variation portion 54m_b of the memory vertical structure 54m, unless otherwise indicated.

In an example, the memory vertical structure 54m may further include voids 54m_V1 and 54m_V2 in the gap-fill insulating layer 60. In an example, in the memory vertical structure 54m, the voids 54m_V1 and 54m_V2 may include a first void 54m_V1 disposed in the first memory vertical portion 54m_L and a second void 54m_V2 disposed in the second memory vertical portion 54m_U. In the memory vertical structure 54m, the first void 54m_V1 and the second void 54m_V2 may be spaced apart from each other.

In FIG. 3B, the supporter vertical structure 54s may include a first supporter vertical portion 54s_L disposed on a level substantially the same as a level of the first memory vertical portion 54m_L, a second supporter vertical portion 54s_U disposed on a level substantially the same as a level of the second memory vertical portion 54m_U, and a width variation portion 54s_b disposed between the first supporter vertical portion 54s_L and the second supporter vertical portion 54s_U. A width of an upper region of the first supporter vertical portion 54s_L adjacent to the second supporter vertical portion 54s_U may be greater than a width of a lower region of the second supporter vertical portion 54s_U adjacent to the first supporter vertical portion 54s_L.

In an example, the supporter vertical structure 54s may include a portion penetrating the second stack structure ST_U2 or may be spaced apart from the second stack structure ST_U2, depending on the position in which the supporter vertical structure 54s is disposed. For example, when a portion of the supporter vertical structure $\sqrt[3]{s}$ penetrates the staircase region SAa of the second stack structure ST_U2, the first supporter vertical portion 54s_L may penetrate the lower stack structure ST_L and the first stack structure ST_U1 and may be in contact with the lower pattern layer 18 of the pattern structure 16 and the second supporter vertical portion 54s_U may extend from the first supporter vertical portion 54s_L, may penetrate the second stack structure ST_U2 and may extend into the capping insulating structure 90. In another example, when a portion of the supporter vertical structure 54s penetrates a staircase region SAa of the first stack structure ST_U1, the first supporter vertical portion 54s_L may be in contact with the lower pattern layer 18 of the pattern structure 16, may penetrate the lower stack structure ST_L and the first stack structure ST_U1, and may extend into the capping insulating structure 90 and the second supporter vertical portion 54s_U may be surrounded by a side surface and an upper surface of the capping insulating structure 90 and may be spaced apart from the second stack structure ST_U2.

In an example, the supporter vertical structure 54s may further include voids 54s_V1 and 54s_V2 disposed in the gap-fill insulating layer 60s. In an example, in the supporter vertical structure 54s, the voids 54s_V1 and 54s_V2 may include a first void 54s_V1 disposed in the first supporter vertical portion 54s_L and a second void 54s_V2 disposed in the second supporter vertical portion 54s_U. In the supporter vertical structure 54s, the first void 54s_V1 and the second void 54s_V2 may be spaced apart from each other.

In the FIG. 3C, the first dam vertical structure 54d1 may include a first dam vertical portion 54d_L disposed on a level substantially the same as a level of the first memory vertical portion 54m_L, a second dam vertical portion 54d_U disposed on a level substantially the same as a level of the second memory vertical portion 54m_U, and a width variation portion 54d_b disposed between the first dam vertical portion 54d_L and the second dam vertical portion 54d_U. A width of an upper region of the first dam vertical portion 54d_L adjacent to the second dam vertical portion 54d_U may be greater than a width of a lower region of the second dam vertical portion 54d_U adjacent to the first dam vertical portion 54d_L. The second dam vertical structure 54d2 (in FIGS. 1A and 2A) may have substantially the same shape as that of the first dam vertical structure 54d1. For example, the second dam vertical structure 54d2 (in FIGS. 1A and 2A) may include the first dam vertical portion 54d_L, the second dam vertical portion 54d_U, and the width variation portion 54d_b.

In an example, in the first dam vertical structure 54d1, the first dam vertical portion 54d_L may penetrate the lower stack structure ST_L and the first stack structure ST_U1 and may be in contact with the lower pattern layer 18 of the pattern structure 16 and the second dam vertical portion 54d_U may extend from the first dam vertical portion 54d_L, may penetrate the second stack structure ST_U2, and may extend into the capping insulating structure 90. In the second dam vertical structure 54d2 (in FIG. 2A), the first dam vertical portion 54d_L may be in contact with the lower pattern layer 18 of the pattern structure 16, may penetrate the lower stack structure ST_L and the first stack structure ST_U1 and may extend into the capping insulating structure 90 and a side surface and an upper surface of the second dam vertical portion 54d_U may be surrounded by the capping insulating structure 90 and the second dam vertical portion 54d_U and the second dam vertical portion 54d_U may be spaced apart from the stack structure ST_U2.

As described with reference to FIGS. 1A to 2B, the side surfaces of the gate horizontal layers 35G, 39G, and 43G may be surrounded by the first dam vertical structure 54d1. Accordingly, the first dam vertical structure 54d1 may include a portion disposed between the insulating horizontal layers 35I, 39I, and 43I and the gate horizontal layers 35G, 39G, and 43G.

In an example, the first dam vertical structure 54d1 may further include voids 54d_V1 and 54d_V2 disposed in the gap-fill insulating layer 60d. In an example, in the first dam vertical structure 54d1, the voids 54d_V1 and 54d_V2 may include a first void 54d_V1 disposed in the first dam vertical structure 54d1 and a second void 54d_V2 disposed in the second dam vertical portion 54d_U. In the first dam vertical structure 54d1, the first void 54d_V1 and the second void 54d_V2 may be spaced apart from each other.

Figure 3D:
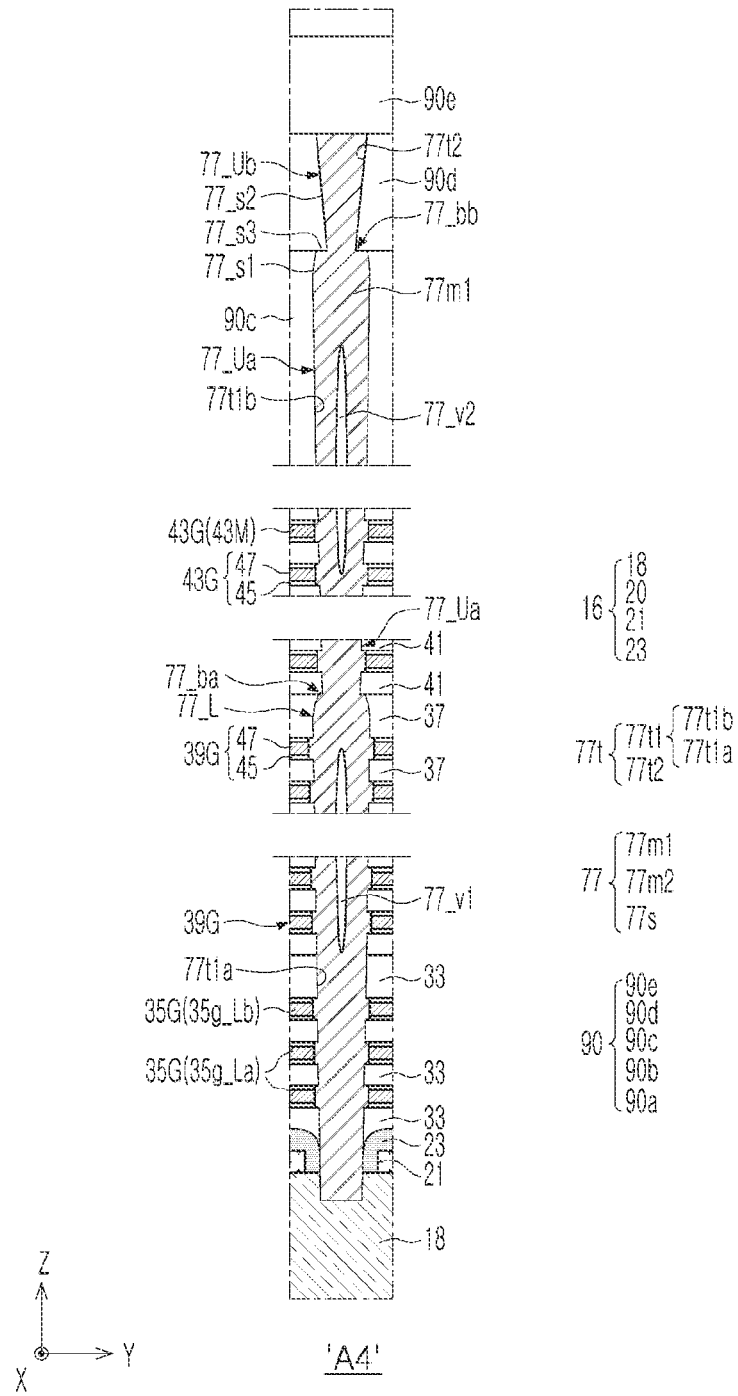

In the description below, to describe the separation structures 77 formed to have the same material and the same structure, a cross-sectional structure of one of the separation structures 77, a first separation structure 77m1, for example, will be described with reference to FIG. 3D. FIG. 3D is an enlarged cross-sectional diagram illustrating portion "A4" illustrated in FIG. 2B.

Referring to FIG. 3D, the first separation structure 77m1 may include a first separation vertical portion 77_L disposed on a level substantially the same as a level of the first memory vertical portion 54m_L and filling the first separation trench 77t1a, a second separation vertical portion 77_Ua disposed on a level substantially the same level as a level of the second memory vertical portion 54m_U and filling the second separation trench 77t1b, and an upper vertical portion 77_Ub disposed on the second separation vertical portion 77_Ua and filling an upper separation trench 77t2. The first and second separation trenches 77t1a and 77t1b may be defined as a lower separation trench 77t1. The lower separation trench 77t1 and the upper separation trench 77t2 may form a separation trench 77t. Accordingly, the first separation structure 77m1 may be formed of a separation gap-fill material layer filling the separation trench 77t.

The first separation structure 77m1 may include a first width variation portion 77_ba disposed between the first separation vertical portion 77_L and the second separation vertical portion 77_Ua, and a second width variation portion 77_bb disposed between the second separation vertical portion 77_Ua and the upper separation vertical portion 77_Ub.

A width of the upper region of the first separation vertical portion 77_L adjacent to the second separation vertical portion 77_Ua may be greater than a width of the lower region of the second separation vertical portion 77_Ua adjacent to the first separation vertical portion 77_L. A width of the upper region of the second separation vertical portion 77_Ua adjacent to the upper separation vertical portion 77_Ub may be greater than a width of the lower region of the upper separation vertical portion 77_Ub adjacent to the second separation vertical portion 77_Ub.

In an example, the first separation structure 77m1 may include a first side surface 77_s1, a second side surface 77_s2 disposed on a level higher than a level of the first side surface 77_s1 and not arranged perpendicularly to the first side surface 77_s1, and a connection side surface extending from the first side surface 77_s1 to the second side surface 77_s2. In the first separation structure 77m1, at least a portion of a connection side 77_s3 may be disposed on a level the same as a level of upper surfaces of the memory vertical structures 54m, the supporter structures 54s, and the dam vertical structures 54d. In the first separation structure 77m1, the first side 77_s1 may be an upper side surface of the second separation vertical portion 77_Ua, the second side surface 77_s2 may be a lower side surface of the upper separation vertical portion 77_Ub, and the connection side surface 77_s3 may be a surface of the second width variation portion 77_bb.

In an example, the first separation structure 77m1 may include a portion penetrating the second stack structure ST_U2 or may be spaced apart from the second stack structure ST_U2, depending on the position in which the first separation structure 77m1 is disposed. For example, when a portion of the first separation structure 77m1 penetrates the staircase region SAa of the second stack structure ST_U2, the first separation vertical portion 77_L may penetrate the lower stack structure ST_L and the first stack structure ST_U1, and may be in contact with the lower pattern layer 18 of the pattern structure 16 and the second separation vertical portion 77_U may extend from the first separation vertical portion 77_L, may penetrate the second stack structure ST_U2 and may extend into the capping insulating structure 90. In another example, when a portion of the first separation structure 77m1 penetrates the staircase region SAa of the first stack structure ST_U1, the first separation vertical portion 77_L may be in contact with the lower pattern layer 18 and the upper pattern layer 23 of the pattern structure 16, may penetrate the lower stack structure ST_L and the first stack structure ST_U1, and may extend into the capping insulating structure 90 and a side surface of the second separation vertical portion 77_Ua may be surrounded by the capping insulating structure 90 and the second separation vertical portion 77_Ua may be spaced apart from the second stack structure ST_U2. A side surface and an upper surface of the third separation vertical portion 77_Ub may be surrounded by the capping insulating structure 90 and the third separation vertical portion 77_Ub may be spaced apart from the second stack structure ST_U2.

In an example, the first separation structure 77m1 may be spaced apart from the first and second intermediate pattern layers 20 and 21 of the pattern structure 16. For example, the first separation structure 77m1 may penetrate a region in which the lower pattern layer 18 is in contact with the upper pattern layer 23 and may extend into the lower pattern layer 18.

In the first separation structure 77m1, the separation gap-fill material layer filling the lower separation trench 77t1 and the upper separation trench 77t2 may include a single material layer or a plurality of material layers. For example, the first separation structure 77m1 may be formed of a separation gap-fill material layer including an insulating material such as silicon oxide. In another example, the first separation structure 77m1 may be formed of a separation gap-fill material layer including a gap-fill pattern of a conductive material and an insulating layer of an insulating material surrounding side surfaces of the gap-fill pattern.

When the separation gap-fill material layer of the first separation structure 77m1 is formed of silicon oxide, the silicon oxide may be formed by a semiconductor process different from the process for forming silicon oxide of the capping insulating structure 90. For example, the separation gap-fill material layer of the first separation structure 77m1 may be formed of a first silicon oxide by an atomic layer deposition (ALD) process and the capping insulating structure 90 may be formed of a second silicon oxide by a process different from the ALD process, a CVD process for example. The capping insulating structure 90 is not limited to the CVD process, and the second silicon oxide may be formed by a process different from the ALD process, a plasma deposition process or a coating process for example.

In an example, the first separation structure 77m1 may further include voids 77_v1 and 77_v2 in the separation gap-fill material layer. In an example, in the first separation structure 77m1, the voids 77_v1, 77_v2 may include the first void 77_v1 disposed in the first separating vertical portion 77_L and a second void 77_v2 disposed in the second separating vertical portion 77_Ua. In the first separation structure 77m1, the first void 77_v1 and the second void 77_v2 may be spaced apart from each other.

In FIGS. 3A and 3D, a maximum width of the first and second voids 77_v1 and 77_v2 in the first separation structure 77m1 may be greater than a maximum width of the first and second voids 54m_V1 and 54m_V2 in the memory vertical structure 54m. A length of one of the first and second voids 77_v1 and 77_v2 in the vertical direction, disposed in the first separation structure 77m1, may be greater than a length of one of the first and second voids 54m_V1 and 54m_V2 in the vertical direction, disposed in the memory vertical structure 54m.

In FIGS. 3B and 3D, a maximum width of the first and second voids 77_v1 and 77_v2 disposed in the first separation structure 77m1 may be greater than a maximum width of the first and second voids 54s_V1 and 54s_V2 disposed in the supporter vertical structure 54s. A length of one of the first and second voids 77_v1 and 77_v2 in the vertical direction, disposed in the first separation structure 77m1, may be greater than a length of one of the first and second voids 54s_V1 and 54s_V2 in the vertical direction, disposed in the supporter vertical structure 54s.

In FIGS. 3C and 3D, a maximum width of the first and second voids 77_v1 and 77_v2 in the first separation structure 77m1 may be greater than a maximum width of the first and second voids 54d_V1 and 54d_V2 disposed in the first dam vertical structure 54d1. A length of one of the first and second voids 77_v1 and 77_v2 in the vertical direction, disposed in the first separation structure 77m1, may be greater than a length of one of the first and second voids in the vertical direction, disposed in the first dam vertical structure 54d1.

In FIGS. 3A, 3B, and 3C, a maximum width of the first and second voids 54d_V1 and 54d_V2 disposed in the first dam vertical structure 54d1 may be greater than a maximum width of the first and second voids 54s_V1 and 54s_V2 disposed in the supporter vertical structure 54s or a maximum width of the first and second voids 54m_V1 and 54m_V2 disposed in the memory vertical structure 54m.

A length of one of the first and second voids 54d_V1 and 54d_V2 in the vertical direction, disposed in the first dam vertical structure 54d1, may be greater than a length of one of the first and second voids 54s_V1 and 54s_V2 in the vertical direction, disposed in the supporter vertical structure 54s, or a length of one of the first and second voids 54m_V1 and 54m_V2 in the vertical direction, disposed in the memory vertical structure 54m.

In the description below, a modified example of the first and second voids 54s_V1 and 54s_V2, spaced apart from each other, of the supporter vertical structure 54s described in FIG. 3B will be described with reference to FIG. 4.

Figure 4:
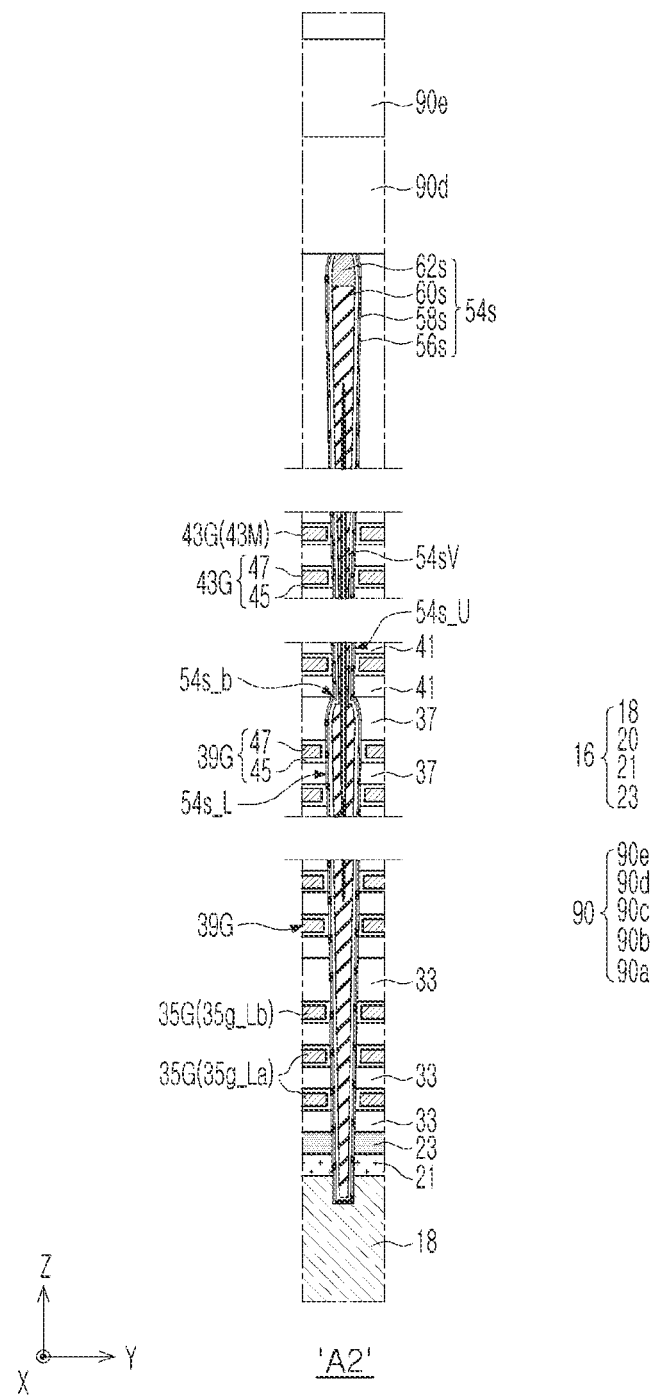
FIG. 4 is an enlarged cross-sectional diagram illustrating a modified example of a semiconductor device according to an example embodiment of the present disclosure.

In a modified example, referring to FIG. 4, the supporter vertical structure 54s may include a void 54sV disposed in the gap-fill insulating layer 60s and extending from the first supporter vertical portion 54s_L to the second supporter vertical portion 54s_U. Accordingly, a portion of the void 54sV may penetrate an internal portion of the width variation portion 54s_b of the supporter structure 54s.

In the description below, a modified example of the first and second voids 54d_V1 and 54d_V2, spaced apart from each other, of the first dam vertical structure 54d1 described in FIG. 3C will be described with reference to FIG. 5.

Figure 5:
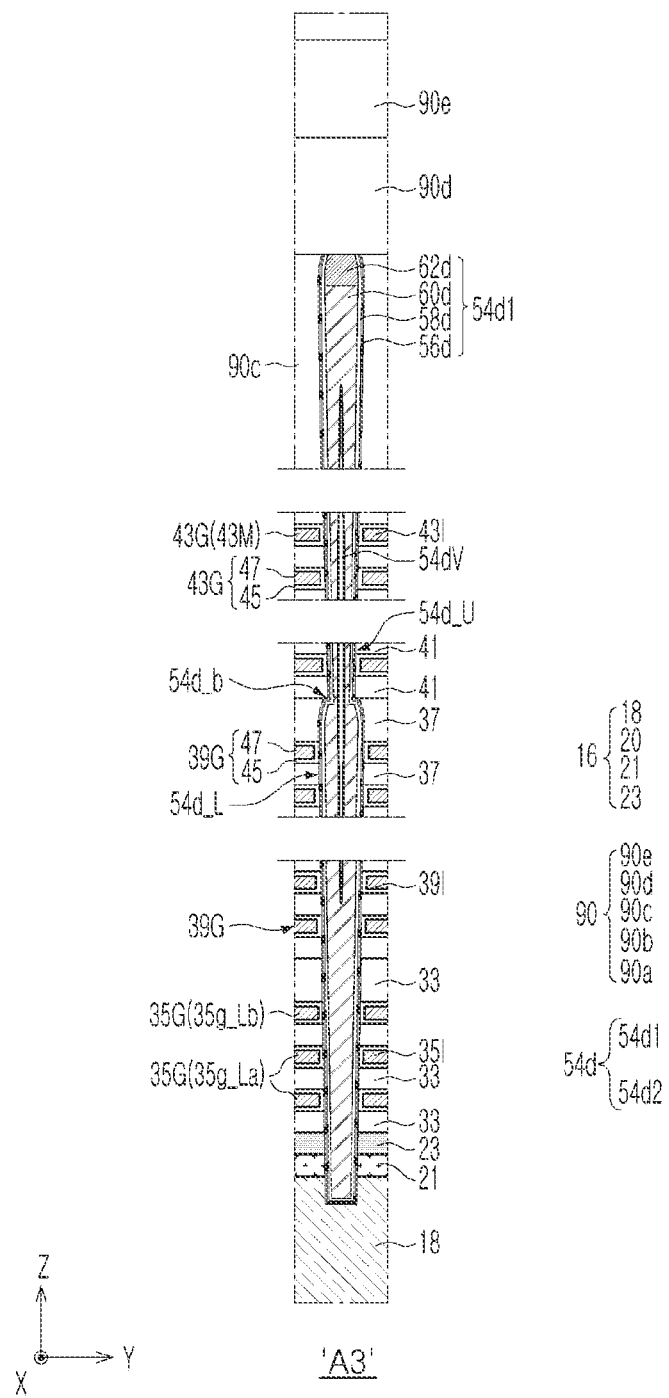
FIG. 5 is an enlarged cross-sectional diagram illustrating a modified example of a semiconductor device according to an example embodiment of the present disclosure.

In the modified example, referring to FIG. 5, the first dam vertical structure 54d1 may include a void 54dV disposed in the gap-fill insulating layer 60d and extending from the first dam vertical portion 54d_L to the second dam vertical portion 54d_U. Accordingly, a portion of the void 54dV may pass through the width variation portion 54d_b of the first dam vertical structure 54d1.

A modified example of the first and second voids 77_v1 and 77_v2, spaced apart from each other, of the first separation structure 77m1 described with reference to FIG. 3D will be described with reference to FIG. 6.

Figure 6:
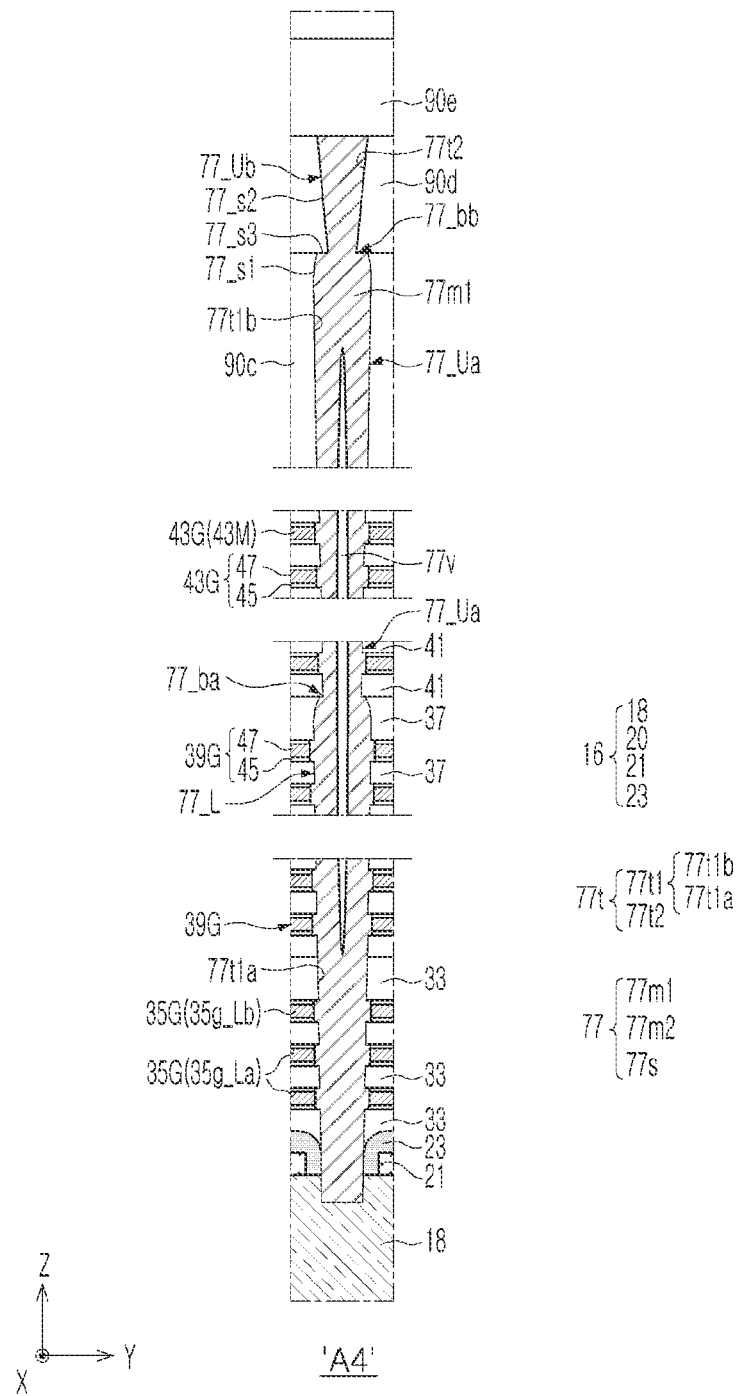
FIG. 6 is an enlarged cross-sectional diagram illustrating a modified example of a semiconductor device according to an example embodiment of the present disclosure.

In the modified example, referring to FIG. 6, a void 77v disposed in the separation gap-fill layer of the first separation structure 77m1 may extend from the first dam vertical portion 77_L to the second dam vertical portion 77_Ua. Accordingly, a portion of the void 77v may penetrate an internal portion of the first width variation portion 77_ba of the first dam vertical structure 77m1.

In FIGS. 4 and 6, a maximum width of the void 77v in the first dam vertical structure 77m1 may be greater than a maximum width of the void 54sV in the supporter vertical structure 54s. A length of the void 77v in the vertical direction, disposed in the first dam vertical structure 77m1, may be greater than a length of the void 54sV in the vertical direction, disposed in the supporter vertical structure 54s.

In FIGS. 5 and 6, a maximum width of the void 77v in the first dam vertical structure 77m1 may be greater than a maximum width of the void 54dV in the first dam vertical structure 54d1. A length of the void 77v in the vertical direction, disposed in the first dam vertical structure 77m1, may be greater than a length of the void 54dV in the vertical direction, disposed in the first dam vertical structure 54d1.

In FIGS. 4 and 5, a maximum width of the void 54dV in the first dam vertical structure 54d1 may be greater than a maximum width of the void 54sV in the supporter vertical structure 54s. A length direction of the void 54dV in the vertical direction, disposed in the first dam vertical structure 54d1, may be greater than a length of the void 54sV in the vertical direction, disposed in the supporter vertical structure 54s.

A modified example of the dam vertical structure 54d in FIG. 1B will be described with reference to FIG. 7.

Figure 7:
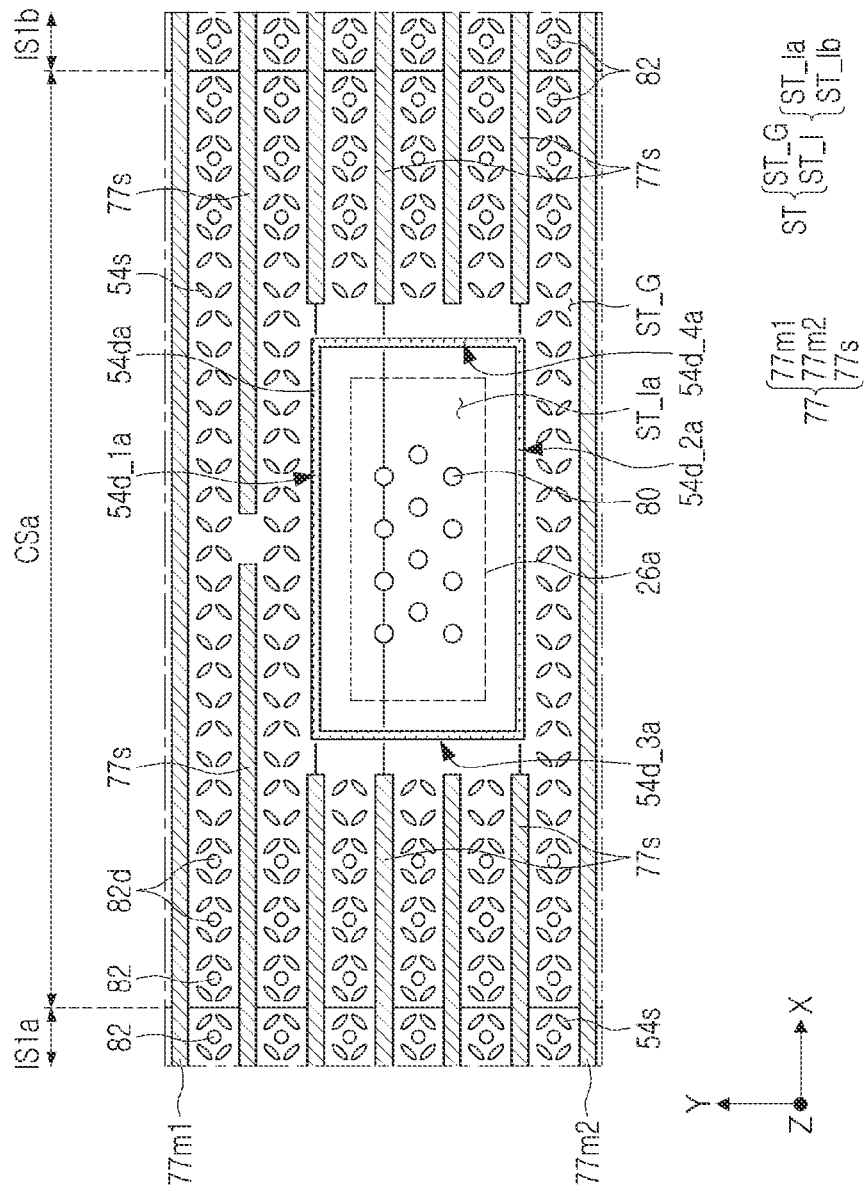
FIG. 7 is an enlarged cross-sectional diagram illustrating a modified example of a semiconductor device according to an example embodiment of the present disclosure.

In the modified example, referring to FIG. 7, the dam vertical structure 54da may include a pair of first and second linear portions 54d_1a and 54d_2a extending in the first direction X and a pair of third and fourth lines 54d_3a and 54d_4a extending in the second direction Y.

In an example, a width of each of the first to fourth linear portions 54d_1a, 54d_2a, 54d_3a, and 54d_4a of the dam vertical structure 54da may be smaller than a width of each of the separation structures 77.

A modified example of the dam vertical structure 54d in FIG. 1B will be described with reference to FIG. 8.

Figure 8:
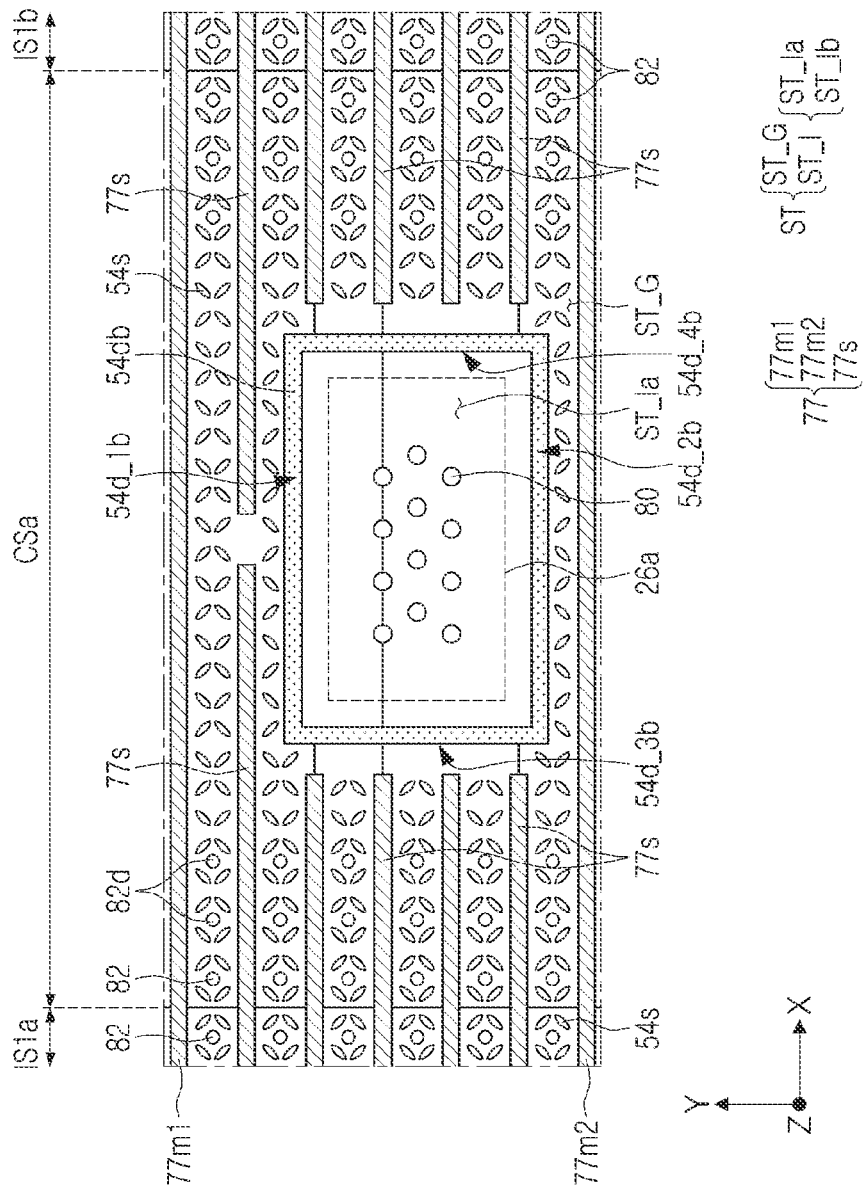
FIG. 8 is an enlarged cross-sectional diagram illustrating a modified example of a semiconductor device according to an example embodiment of the present disclosure.

In the modified example, referring to FIG. 8, the dam vertical structure 54db may include a pair of first and second linear portions 54d_1b and 54d_2b extending in the first direction X and a pair of third and fourth lines 54d_3b and 54d_4b extending in the second direction Y.

When viewed on a plane, the separation structures 77 may be spaced apart from each other in the second direction Y by a first distance and the first linear portion 54d_1b may be spaced apart from one of the separation structures 77, e.g., the auxiliary separation structure 77s, opposing the first linear portion 54d_1b in the second direction Y by a second distance greater than the first distance. The second linear portion 54d_2b may be spaced apart from the second main separation structure 77m2 opposing the second linear portion 54d_2b in the second direction Y by the second distance smaller than the first distance.

A modified example of the dam vertical structure 54d in FIG. 1B will be described with reference to FIG. 9.

Figure 9:
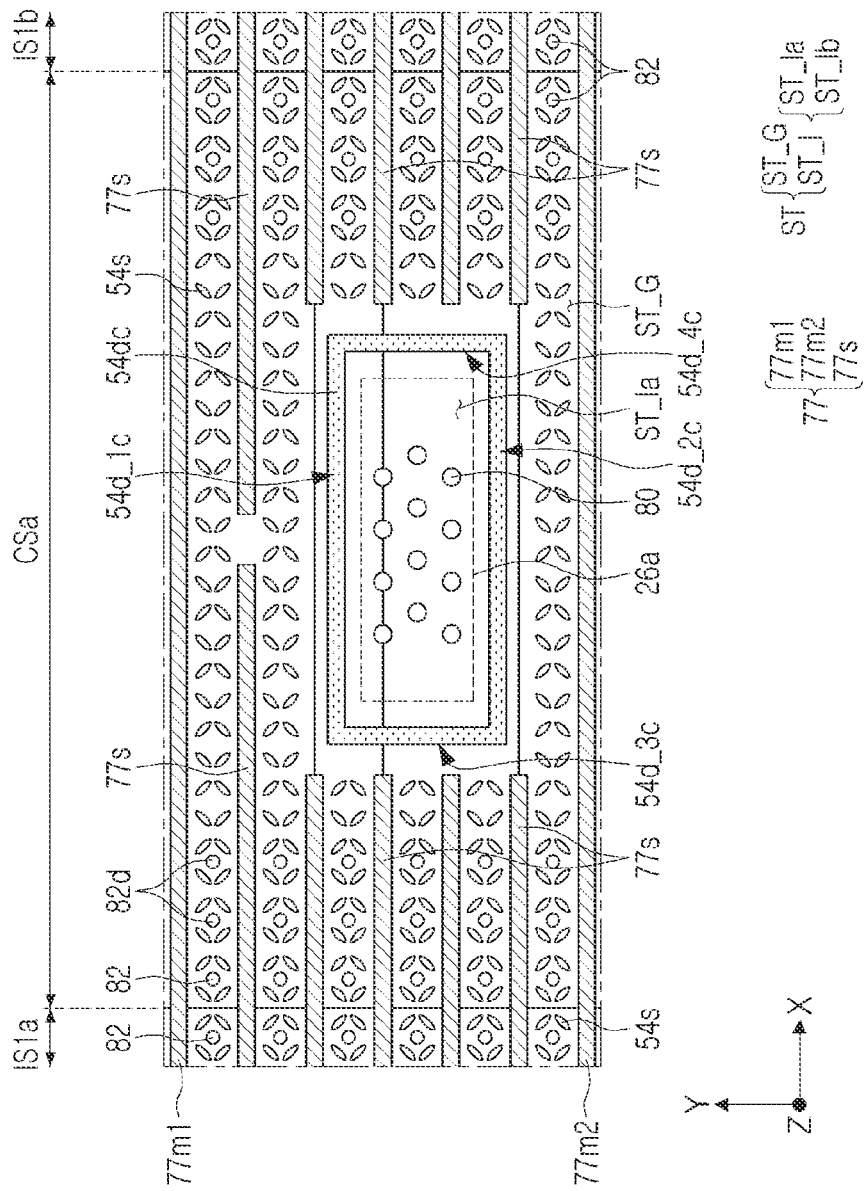
FIG. 9 is an enlarged cross-sectional diagram illustrating a modified example of a semiconductor device according to an example embodiment of the present disclosure.
Figure 10:
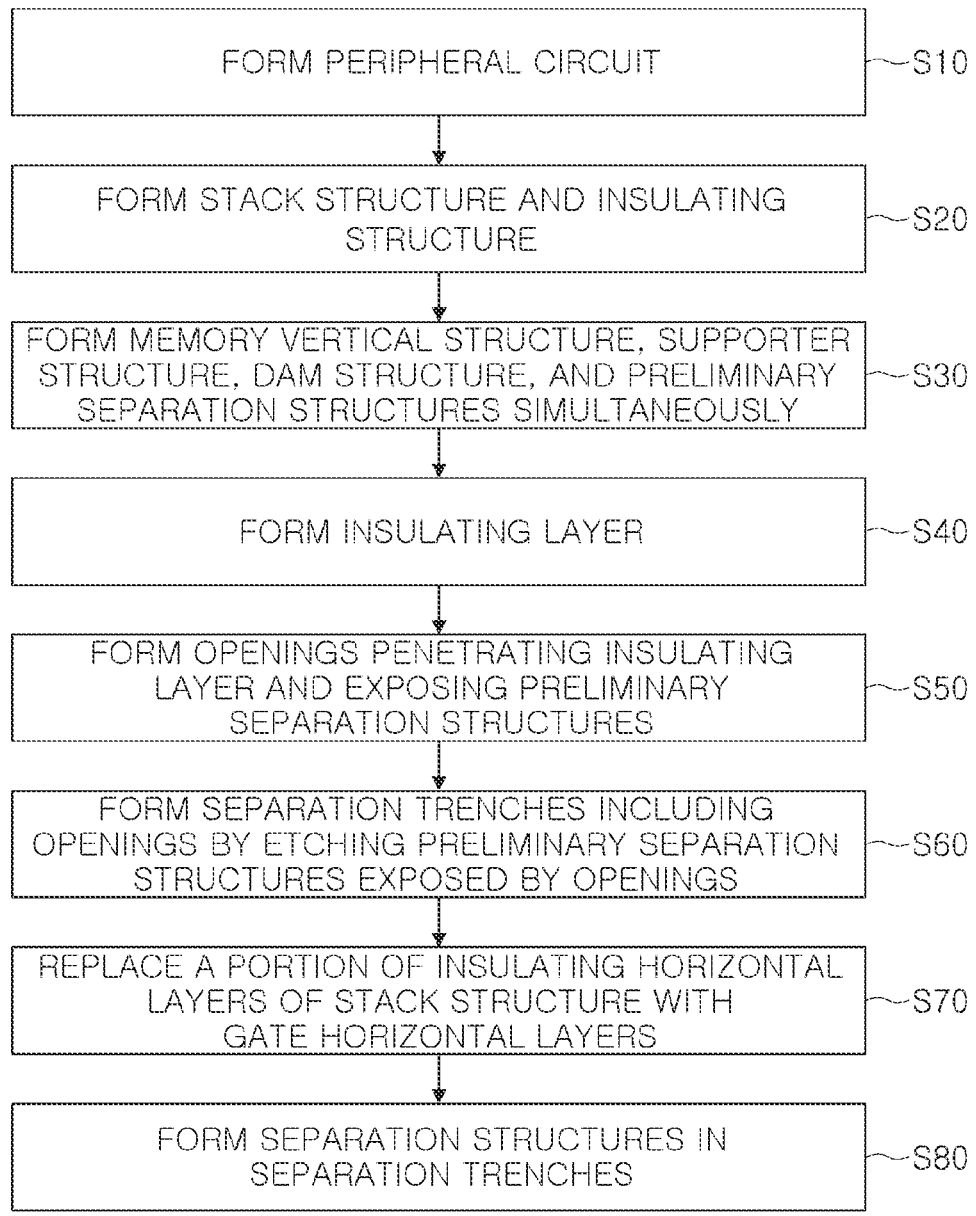
FIGS. 10 to 13B are diagrams illustrating a method of manufacturing a semiconductor device according to an example embodiment of the present disclosure.

In the modified example, referring to FIG. 9, the dam vertical structure 54dc may include a pair of first and second linear portions 54d_1c and 54d_2c extending in the first direction X and a pair of third and fourth lines 54d_3c and 54d_4c extending in the second direction Y.

When viewed on a plane, the separation structures 77 may be spaced apart from each other in the second direction Y by a first distance and the first linear portion 54d_1c may be spaced apart from one of the separation structures 77, e.g., the auxiliary separation structure 77s, opposing the first linear portion 54d_1c in the second direction Y by a second distance greater than the first distance. The second linear portion 54d_2c may be spaced apart from the second main separation structure 77m2 opposing the second linear portion 54d_2c in the second direction Y by the second distance smaller than the first distance.

Figure 11A:
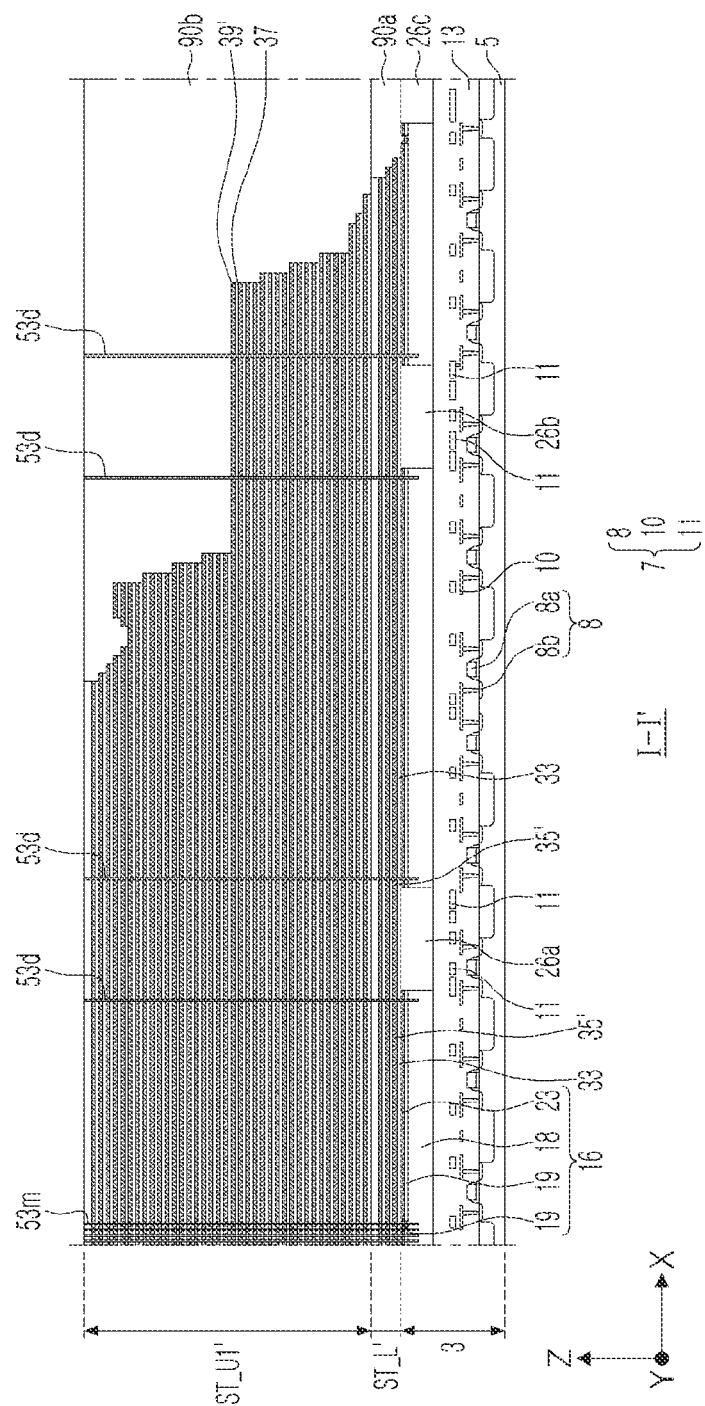
Figure 11B:
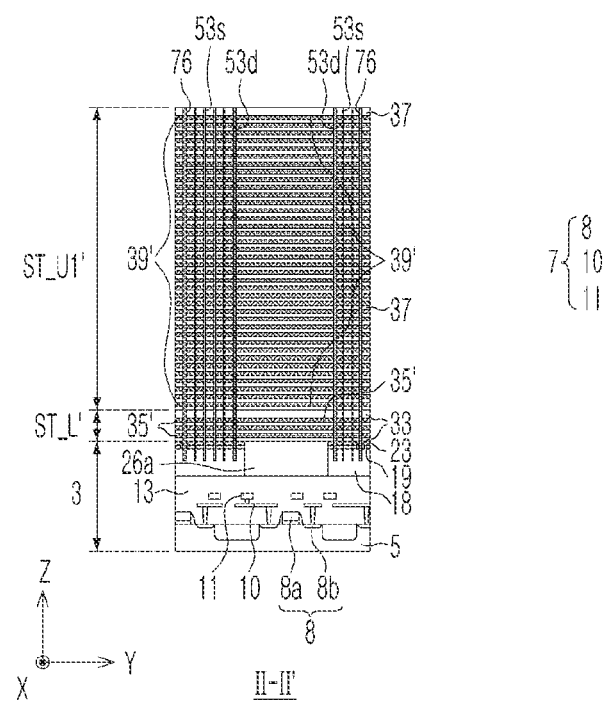
Figure 12A:
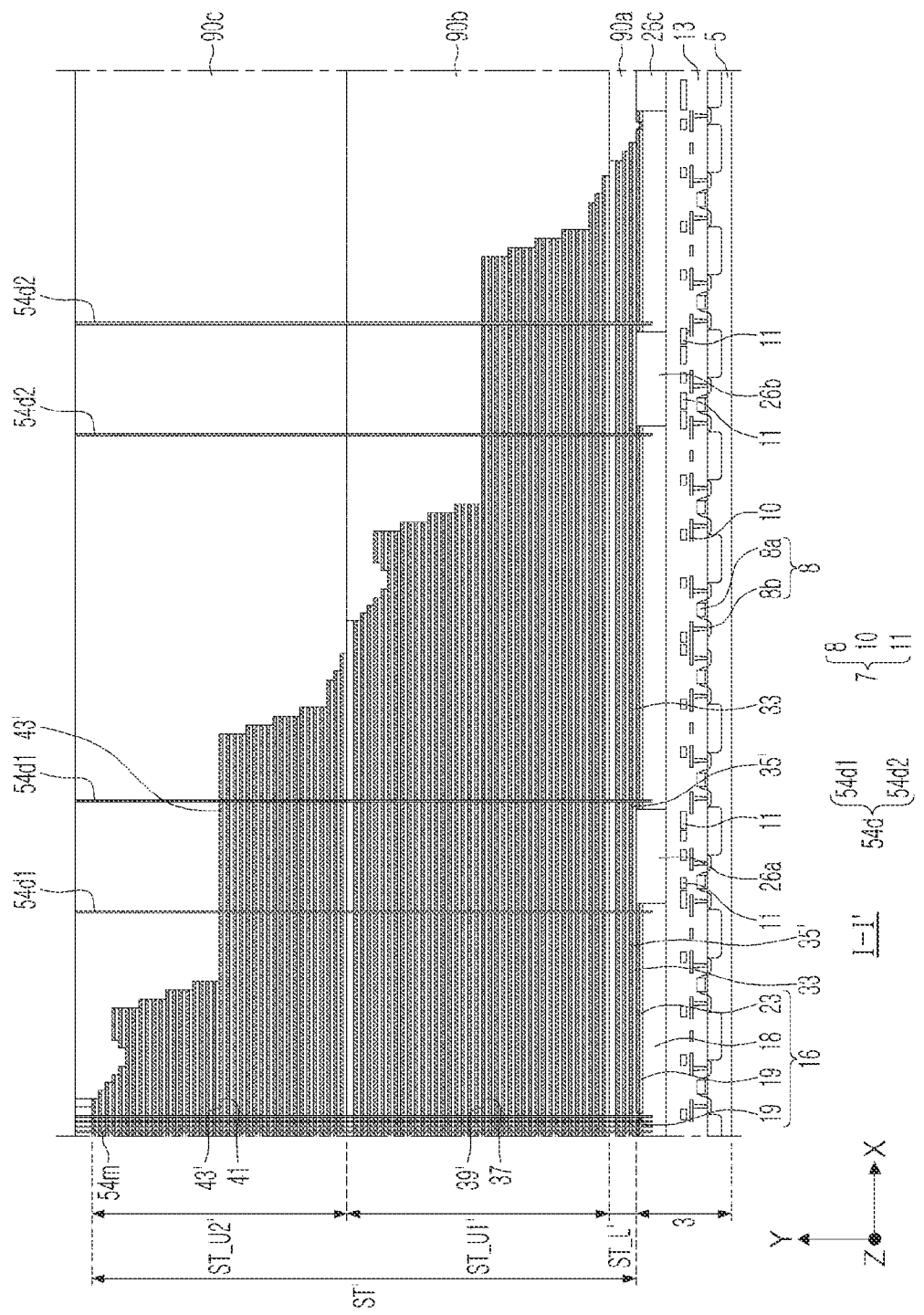
Figure 12B:
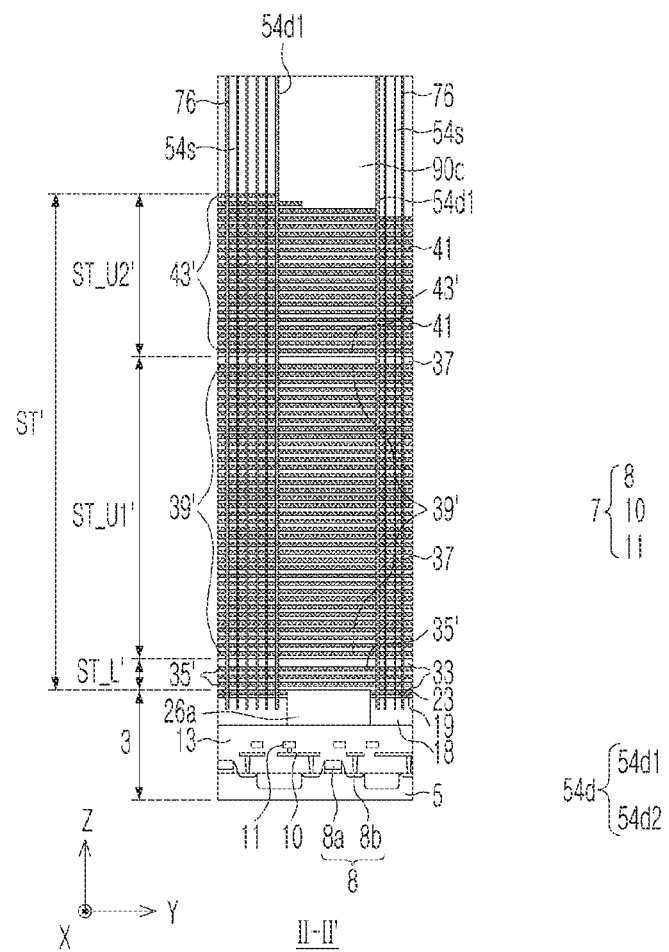
Figure 13A:
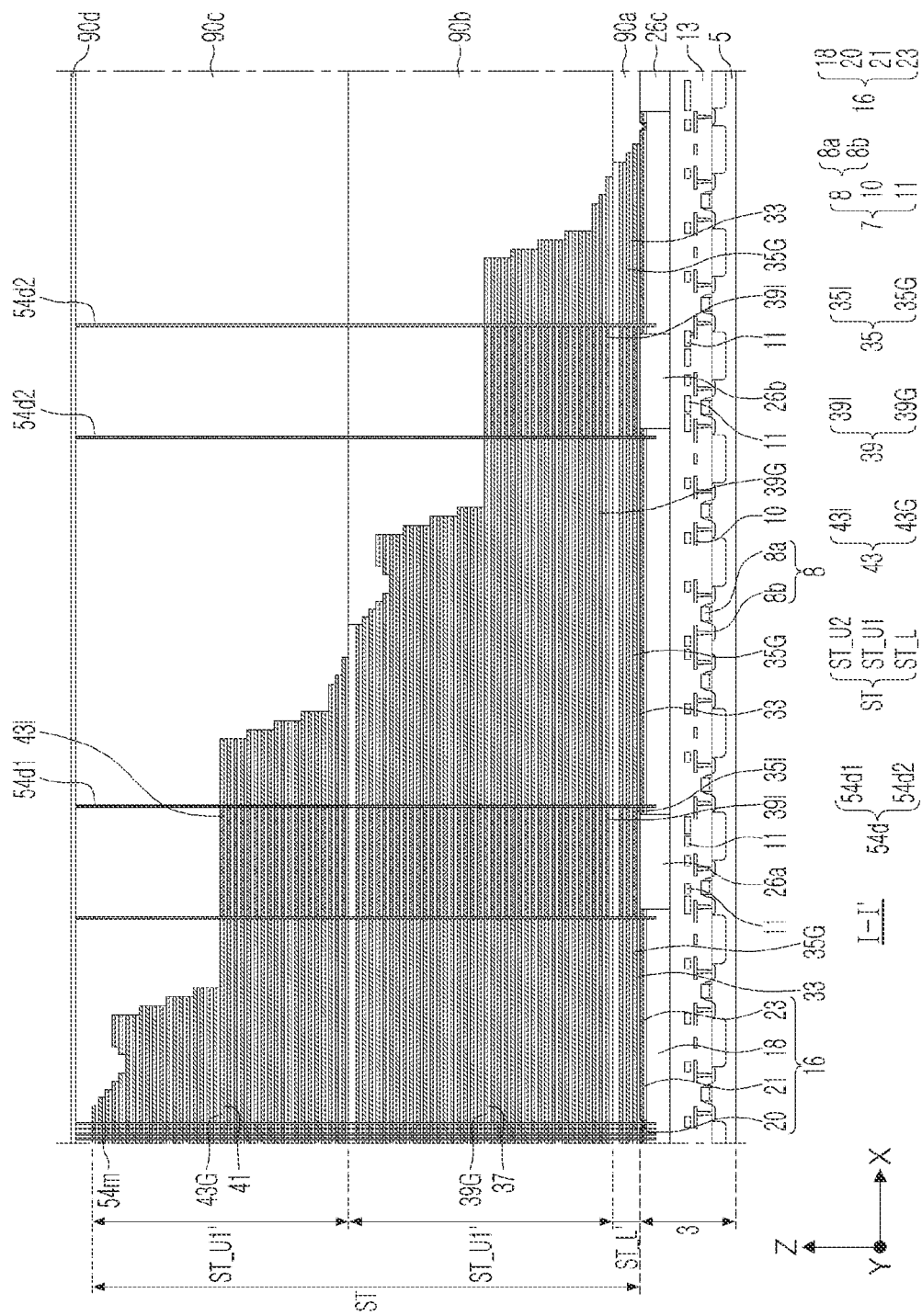
Figure 13B:
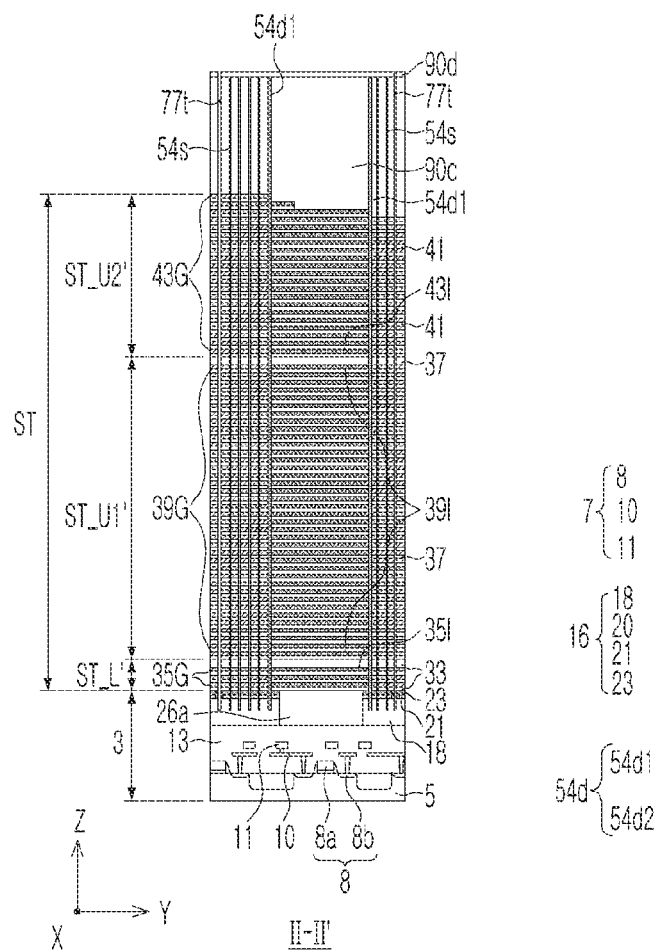

In the description below, a method of manufacturing the semiconductor device described in the example embodiments will be described with reference to FIGS. 10 to 13B. In FIGS. 10 to 13B, FIG. 10 is a flowchart illustrating a method of manufacturing a semiconductor device according to an example embodiment. FIGS. 11A, 12A, and 13A are cross-sectional diagrams along line I-I' in FIG. 1B. FIGS. 11b, 12b, and 13b are cross-sectional diagrams along line II-II' in FIG. 1B.

Referring to FIGS. 1A, 1B, 10, 11A, and 11B, a lower structure 3 may be formed. The lower structure 3 may include a semiconductor substrate 5, a peripheral circuit 7 on the semiconductor substrate 5, a lower insulating layer 13 covering the peripheral circuit 7 on the semiconductor substrate 5, a pattern structure 16 on the lower insulating layer 13, intermediate insulating layers 26a and 26b penetrating the pattern structure 16, and an external insulating layer 26c covering an external surface of the pattern structure 16. Accordingly, the peripheral circuit 7 may be formed (S10).

The pattern structure 16 may include a lower pattern layer 18, an intermediate pattern layer 19 on the lower pattern layer 18, and an upper pattern layer 23 on the intermediate pattern layer 19. The intermediate pattern layer 19 may include a silicon oxide layer, a silicon nitride layer, and a silicon oxide layer stacked in order. The lower and upper pattern layers 18 and 23 may be polysilicon layers. The upper pattern layer 23 may include a portion penetrating the intermediate pattern layer 19 and directly in contact with the lower pattern layer 18.

A preliminary lower stack structure ST_L' may be formed on the lower structure 3. The preliminary lower stack structure ST_L' may include lower interlayer insulating layers 33 and preliminary lower horizontal layers 35' alternately stacked. At least one side of the preliminary lower stack structure ST_L' may be formed to have a staircase shape. A first capping insulating layer 90a may be formed having an upper surface coplanar with the upper surface of the preliminary lower stack structure ST_L' and covering at least one side of the preliminary lower stack structure ST_L1' having a staircase shape.

A first preliminary stack structure ST_U1' may be formed on the preliminary lower stack structure ST_L'. The first preliminary stack structure ST_U1' may include first interlayer insulating layers 37 and first preliminary horizontal layers 39' alternately stacked. The preliminary lower horizontal layers 35' and the first preliminary horizontal layers 39' may be formed of silicon nitride. At least one side of the first preliminary stack structure ST_U1' may be formed in a staircase shape. A second capping insulating layer 90b may be formed having an upper surface coplanar with the upper surface of the first preliminary stack structure ST_U1' and covering at least one side of the first preliminary stack structure ST_U1' having a staircase shape.

A lower memory sacrificial vertical structure 53m, a lower dam sacrificial vertical structure 53d, a lower supporter sacrificial vertical structure 53s and lower separation sacrificial vertical structures 76, penetrating the preliminary lower stack structure ST_L' and the first preliminary stack structure ST_U1', may be formed.

The lower memory sacrificial vertical structure 53m, the lower dam sacrificial vertical structure 53d, the lower supporter sacrificial vertical structure 53s, and the lower separation sacrificial vertical structures 76 may be formed simultaneously. The lower memory sacrificial vertical structure 53m, the lower dam sacrificial vertical structure 53d, the lower supporter sacrificial vertical structure 53s, and the lower separating sacrificial vertical structures 76 may be formed of the same sacrificial material layer.

Referring to FIGS. 1A, 1B, 10, 12A, and 12B, a second preliminary stack structure ST_U2' may be formed on the first preliminary stack structure ST_U1'. The second preliminary stack structure ST_U2' may include second interlayer insulating layers 41 and second preliminary horizontal layers 43' alternately stacked. The second preliminary horizontal layers 43' may be formed of silicon nitride. At least one side of the second preliminary stack structure ST_U2' may be formed in a staircase shape. The third capping insulating layer 90c may be formed having an upper surface coplanar with the upper surface of the second preliminary stack structure ST_U2' and covering at least one side of the second preliminary stack structure ST_U2' having a staircase shape.

The preliminary lower stack structure ST_L', the first preliminary stack structure ST_U1', and the second preliminary stack structure ST_U2' may form a stack structure ST'. The first to third capping insulating layers 90a, 90b, and 90c may form an insulating structure. Accordingly, the stack structure ST' and the insulating structures 90a, 90b, and 90c may be formed (S20).

Upper holes penetrating the second preliminary stack structure ST_U2' and/or the insulating structures 90a, 90b, and 90c, and exposing the lower memory sacrificial vertical structure 53m, the lower dam sacrificial vertical structure 53d, the lower supporter sacrificial vertical structure 53s, and the lower separation sacrificial vertical structures 76 may be formed. The exposed lower memory sacrificial vertical structure 53m, the exposed lower dam sacrificial vertical structure 53d, the exposed lower supporter sacrificial vertical structure 53s, and the exposed lower separation sacrificial vertical structures 76 may be removed to form lower holes, and structures filling the lower holes and the upper holes may be formed. The structures may be a memory vertical structure 54m, a supporter vertical structure 54s, a dam vertical structure 54d, and preliminary separation structures 76. For example, after forming the lower holes and the upper holes, a data storage structure and a channel material layer which conformally cover side surfaces of the lower and upper holes may be formed in order, a gap-fill insulating layer for partially filling the lower and upper holes may be formed, and a pad material layer for fill the remaining portion of the upper holes may be formed on the gap-fill insulating layer.

Accordingly, the memory vertical structure 54m, the supporter vertical structure 54s, the dam vertical structure 54d, and the preliminary separation structures 76 may be simultaneously formed (S30).

Referring to FIGS. 1A, 1B, 10, 13A, and 13B, an insulating layer 90d may be formed (S40). The insulating layer 90d may be formed on the stack structure ST' and the insulating structures 90a, 90b, and 90c. The insulating layer 90d may be a fourth capping insulating layer.

Openings penetrating the insulating layer 90d and exposing the preliminary separation structures 76 may be formed (S50). The openings may be the upper separation trenches 77t2 described with reference to FIG. 3D.

Separation trenches 77t including openings may be formed by etching the preliminary separation structures exposed by the openings (S60). Each of the separation trenches 77t may have substantially the same shape as that of the separation trench 77t described with reference to FIG. 3D.

The separation trenches 77t may penetrate the preliminary stack structure ST' and may extend into the pattern structure 16. The intermediate pattern layer of the memory cell region MCA exposed by the separation trenches 77t may be replaced with the first intermediate pattern layer 20. The first intermediate pattern layer 20 may be formed of a polysilicon layer, and the intermediate pattern layer remaining in the staircase region SA may be referred to as a second intermediate pattern layer 21.

A portion of the insulating horizontal layers of the stack structure ST' may be replaced with gate horizontal layers (S70). The insulating horizontal layers may be the preliminary lower horizontal layers 35', the first preliminary horizontal layers 39', and the second preliminary horizontal layers 43'.

By performing an etching process using the dam vertical structure 54d as an etch barrier layer, the preliminary lower horizontal layers 35', the first preliminary horizontal layers 39', and the second preliminary horizontal layers 43', exposed by the separation trenches 77t and disposed between the separation trenches 77t and the dam vertical structure 54d, may be removed to form empty spaces and the gate horizontal layers 35G, 39G, and 43G filling the empty spaces may be formed. The gate horizontal layers 35G, 39G, and 43G may be the same as those described in FIGS. 1A to 3D. Among the preliminary lower horizontal layers 35', the first preliminary horizontal layers 39' and the second preliminary horizontal layers 43', the horizontal layers surrounded by the dam vertical structure 54d and remaining may be referred to as horizontal layers 35I, 39I, and 43I. Accordingly, horizontal layers 35, 39 and 43 including the gate horizontal layers 35G, 39G, and 43G and the insulating horizontal layers 35I, 39I, and 43I may be formed. Accordingly, a stack structure ST including the horizontal layers 35, 39, and 43 may be formed. The separation structures 77 may be formed in the separation trenches 77t (S80).

Referring back to FIGS. 1A, 1B, 2A, and 2B, through contact plugs 80 and gate contact plugs 82 may be formed. Thereafter, a second capping insulating layer 90e may be formed. Connection patterns 85a, 85b, and 85c may be formed, and bit lines 93a and gate connection wirings 93b may be formed.

In an example embodiment, since the memory vertical structure 54m, the supporter vertical structure 54s, the dam vertical structure 54d, and the preliminary separation structures 76 may be formed simultaneously, productivity may improve, integration density of the semiconductor device 1 may increase, and reliability of the semiconductor device 1 may improve.

In an example embodiment, in the etching process for forming the empty spaces by etching the preliminary lower horizontal layers 35', the first preliminary horizontal layers 39', and the second preliminary horizontal layers 43' exposed by the separation trenches 77t, the dam vertical structure 54d may work as an etch stop layer. Accordingly, the preliminary lower horizontal layers 35', the first preliminary horizontal layers 39', and the second preliminary horizontal layers 43' disposed in a region surrounded by the dam vertical structure 54d may be prevented from being etched. Accordingly, between the first and second main separation structures 77m1 and 77m2, the insulator stack region ST_I defined in the dam vertical structure 54d may be stably secured. Accordingly, due to the dam vertical structure 54d, the space in which the through contact plugs 80 may be disposed may be sufficiently secured without increasing an entire area of the semiconductor device 1. Accordingly, integration density of the semiconductor device 1 may improve.

In an example embodiment, the supporter vertical structure 54s and the dam vertical structure 54d may prevent the interlayer insulating layers 33, 37, and 41 from being bent and deformed in the etching process for forming the empty spaces by etching the preliminary lower horizontal layers 35', the first preliminary horizontal layers 39', and the second preliminary horizontal layers 43', exposed by the separation trenches 77t. Accordingly, since the supporter vertical structure 54s and the dam vertical structure 54d may prevent a thickness of a gate horizontal layer of a portion of the gate horizontal layers 35G, 39G, and 43G from being reduced or may prevent the above-mentioned elements from being separated, reliability of the semiconductor device 1 may improve.

Figure 14:
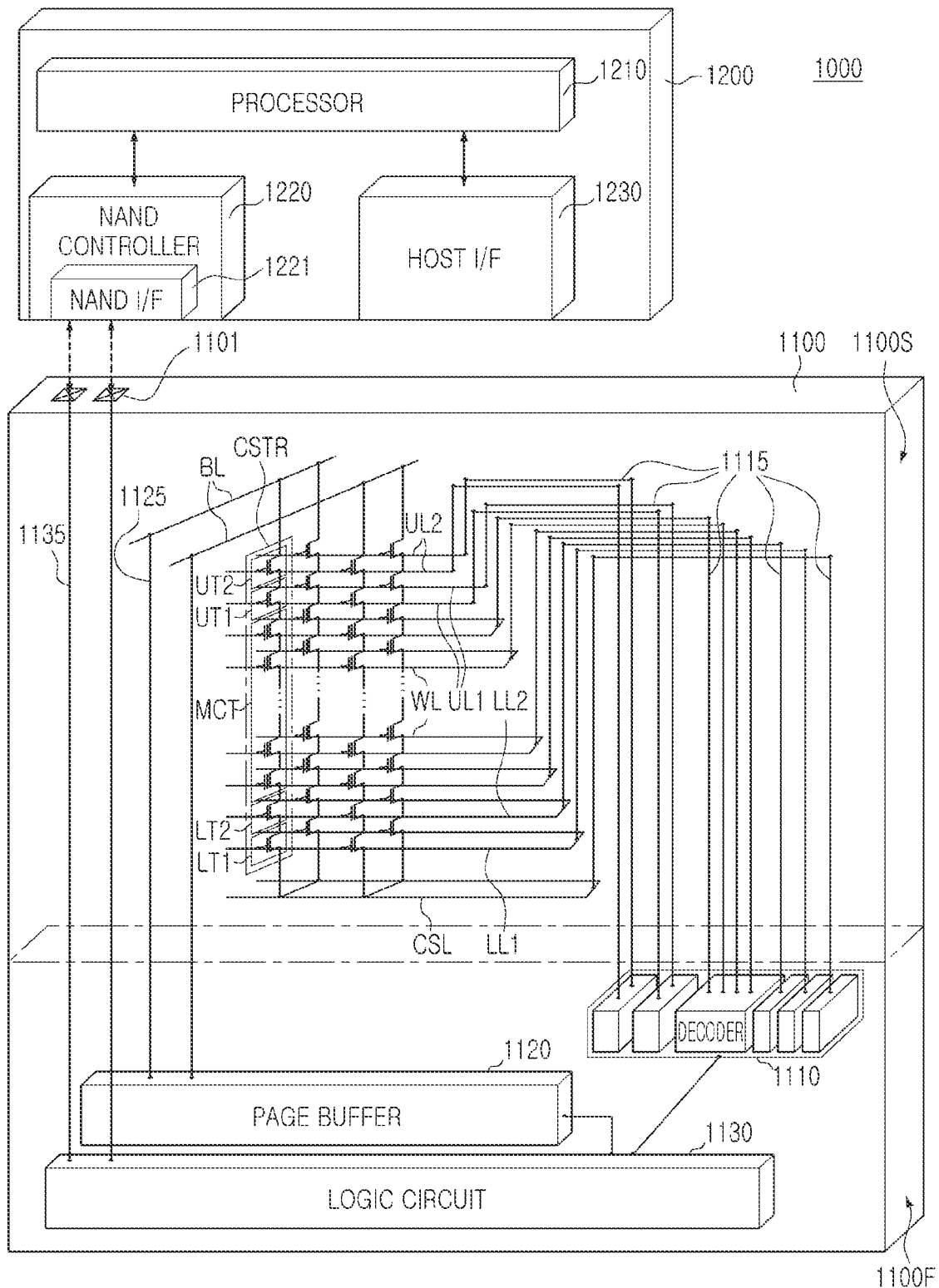
FIG. 14 is a diagram illustrating a data storage system including a semiconductor device according to an example embodiment of the present disclosure.

FIG. 14 is a diagram illustrating a data storage system including a semiconductor device according to an example embodiment.

Referring to FIG. 14, a data storage system 1000 in an example embodiment may include a semiconductor device 1100 and a controller 1200 electrically connected to the semiconductor device 1100. The data storage system 1000 may be implemented by a storage device including the semiconductor device 1100 or an electronic device including a storage device. For example, the data storage system 1000 may be implemented by a solid state drive device (SSD), a universal serial bus (USB), a computing system, a medical device, or a communication device, including the semiconductor device 1100.

In an example embodiment, the data storage system 1000 may be implemented by an electronic system storing data.

The semiconductor device 1100 may be implemented by a semiconductor device described in the aforementioned example embodiments with reference to FIGS. 1 to 13B. The semiconductor device 1100 may include a first structure 1100F and a second structure 1100S on the first structure 1100F.

In example embodiments, the first structure 1100F may be disposed adjacent to the second structure 1100S.

In example embodiments, the semiconductor device 1100 may include two semiconductor chips bonded to each other. For example, in the semiconductor device 1100, the first structure 1100F may be a single semiconductor chip including the peripheral circuit 7 of the lower structure 3 described with reference to at least FIGS. 2A and 2B, and the second structure 1100S may be a single semiconductor chip bonded to the first structure 1100F by a wafer bonding process and including the stack structure ST and the memory vertical structure 54m described with reference to at least one of FIGS. 2A and 2B. For example, pads formed of a copper material of the first structure 1100F and pads formed of a copper material of the second structure 1000S may be in contact with and bonded to each other. Accordingly, the semiconductor device 1100 may include the first and second structures 1100F and 1100S bonded to each other, two semiconductor chips bonded to each other.

The first structure 1100F may be configured as a peripheral circuit structure including a decoder circuit 1110, a page buffer 1120, and a logic circuit 1130. For example, the first structure 1100F may include the aforementioned peripheral circuit 7 (in FIGS. 2A and 2B).

The second structure 1100S may be a memory cell structure including a bit line BL, a common source line CSL, word lines WL, first and second upper gate lines UL1 and UL2, first and second gate lower lines LL1 and LL2, and memory cell strings CSTR disposed between the bit line BL and the common source line CSL.

The pattern structure 16 (in FIG. 2A) described in the aforementioned example embodiment may include silicon layers 18, 20, and 23 having N-type conductivity, and the silicon layer having N-type conductivity may be configured as the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The lower gate lines LL1 and LL2 may be gate electrodes of lower transistors LT1 and LT2, respectively. The word lines WL may be gate electrodes of memory cell transistors MCT, and the gate upper lines UL1 and UL2 may be gate electrodes of the upper transistors UT1 and UT2, respectively.

The gate horizontal layers 35G, 39G, and 43G described above may form the lower gate lines LL1 and LL2, the word lines WL, and the upper gate lines UL1 and UL2. For example, the first and second lower gate horizontal layers 35g_La and 35Lb as in FIG. 3A may form the lower gate lines LL1 and LL2, the gate horizontal layers 39G and 43M may form the word lines WL, and the first and second upper gate horizontal layers 43_g_Ua and 43_g_Ub may form the gate upper lines UL1 and UL2.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation for erasing data stored in the memory cell transistors MCT.

The common source line CSL, the first and second gate lower lines LL1 and LL2, word lines WL, and the first and second gate upper lines UL1 and UL2 may be electrically connected to the decoder circuit 1110 through first connection wirings 1115 extending from the first structure 1100F to the second structure 1100S.

The first connection wirings 1115 may include the gate contact plugs 82, the gate connection wirings 93b, and the through contact plugs 80 described above.

The bit lines BL may be electrically connected to the page buffer 1120 through second connection wirings 1125 extending from the first structure 1100F to the second structure 1100S. The bit lines BL may be the bit lines 93a (in FIGS. 2A and 3A) described above.

In the first structure 1100F, the decoder circuit 1110 and the page buffer 1120 may perform a control operation on at least one select memory cell transistor of the plurality of memory cell transistors MCT. The decoder circuit 1110 and the page buffer 1120 may be controlled by a logic circuit 1130. The semiconductor device 1100 may communicate with the controller 1200 through the input and output pad 1101 electrically connected to the logic circuit 1130. The input and output pad 1101 may be electrically connected to the logic circuit 1130 through an input and output connection wiring 1135 extending from the first structure 1100F to the second structure 1100S.

The controller 1200 may include a processor 1210, a NAND controller 1220, and a host interface 1230. According to example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 15:
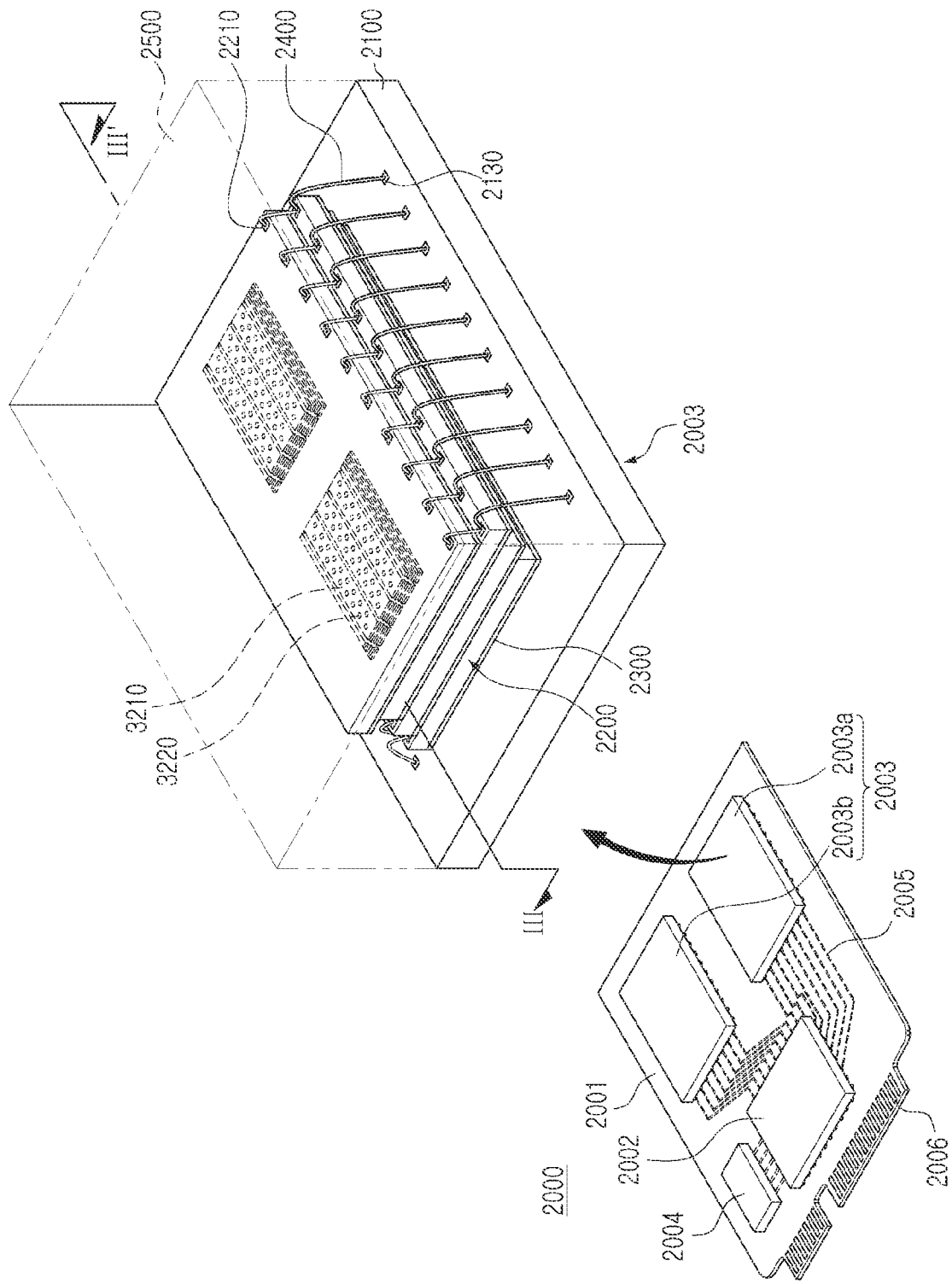
FIG. 15 is a diagram illustrating a data storage system including a semiconductor device according to an example embodiment of the present disclosure.

FIG. 15 is a diagram illustrating a data storage system including a semiconductor device according to an example embodiment.

Referring to FIG. 15, a data storage system 2000 in the example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied according to a communication interface between the data storage system 2000 and the external host. In example embodiments, the data storage system 2000 may communicate with an external host according to one of interfaces such as a universal serial bus (USB), peripheral component interconnect express (PCI-Express), serial advanced technology attachment (SATA), and M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003 and may improve an operation speed of the data storage system 2000.

The DRAM 2004 may be implemented by a buffer memory for reducing a difference in speed between the semiconductor package 2003, a data storage space, and an external host. The DRAM 2004 included in the data storage system 2000 may also operate as a type of cache memory and may provide a space for temporarily storing data in a control operation performed on the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include the semiconductor device described in one of the aforementioned example embodiments with reference to FIGS. 1 to 13B.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be implemented by a printed circuit board including package upper pads 2130. Each of the semiconductor chips 2200 may include an input and output pad 2210.

In example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on an interposer substrate different from the main substrate 2001, and the controller 2002 may be connected to the semiconductor chips 2200 through wiring formed on the interposer substrate.

Figure 16:
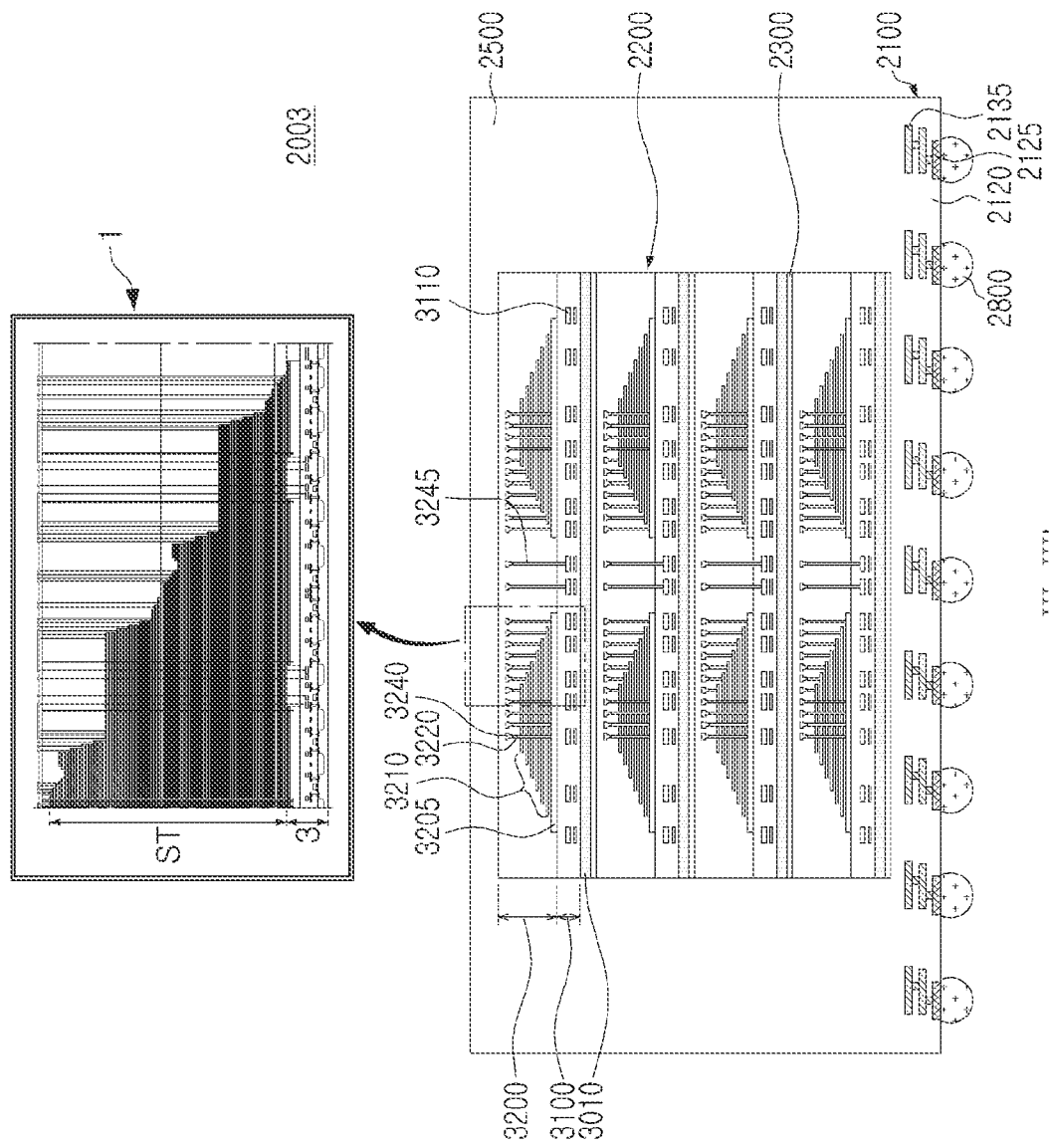
FIG. 16 is a diagram illustrating a data storage system including a semiconductor device according to an example embodiment of the present disclosure.

FIG. 16 is cross-sectional diagrams illustrating a semiconductor package according to an example embodiment. FIG. 16 illustrates an example embodiment of the semiconductor package 2003 illustrated in FIG. 15, and illustrates a cross-sectional region of the semiconductor package 2003 illustrated in FIG. 15 taken along line III-III'.

Referring to FIG. 16, in the semiconductor package 2003, the package substrate 2100 may be configured as a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wirings 2135 electrically connecting the package upper pads 2130 to the lower pads 2125 in the package substrate body portion 2120. The package upper pads 2130 may be electrically connected to the connection structures 2400. The lower pads 2125 may be connected to wiring patterns 2005 of a main substrate 2001 of the data storage system 2000 through conductive connection portions 2800 as illustrated in FIG. 16.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 penetrating the gate stack structure 3210, bit lines 3240 electrically connected to the memory channel structures 3220, and gate connection wirings 93b (in FIG. 2A) electrically connected to word lines WL (in FIG. 14) of the gate stack structure 3210. The first structure 3100 may include the first structure 1100F illustrated in FIG. 14, and the second structure 3200 may include the second structure 1100S illustrated in FIG. 14.

Each of the semiconductor chips 2200 may include a through wiring 3245 electrically connected to the peripheral wirings 3110 of the first structure 3100 and extending into the second structure 3200. The through wiring 3245 may penetrate the gate stack structure 3210 and may be disposed on an external side of the gate stack structure 3210.

Each of the semiconductor chips 2200 may further include an input and output connection wiring 3265 electrically connected to the peripheral wirings 3110 of the first structure 3100 and extending into the second structure 3200, and an input and output pad 2210 electrically connected to the input and output connection wiring 3265.

In FIG. 16, the enlarged portion of the semiconductor device 1, indicated by reference numeral "1", indicates that the semiconductor chips 2200 illustrated in FIG. 16 may be modified to include the cross-sectional structure illustrated in FIG. 2A. Accordingly, each of the semiconductor chips 2200 may include the semiconductor device 1 described in the above-described example embodiments with reference to FIGS. 1 to 13B.

According to the aforementioned example embodiment, a device which may improve integration density and reliability may be provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the example embodiments have been illustrated and described above, it will be apparent to those skilled in the art that modifications and variations could be made without departing from the scope of the present disclosure as defined by the appended claims.

What is claimed is:

1. A semiconductor device comprising:
a lower structure including a peripheral circuit;
a stack structure including interlayer insulating layers and horizontal layers alternately stacked on the lower structure, wherein the stack structure is disposed in a memory cell region and a staircase region adjacent to the memory cell region, and the stack structure has a staircase shape in the staircase region;
a capping insulating structure covering the stack structure on the lower structure;
a first dam vertical structure penetrating the stack structure in the staircase region and extending into the capping insulating structure, wherein the first dam vertical structure divides the stack structure into a gate stack region and an insulator stack region, and among the horizontal layers, horizontal layers disposed in the gate stack region are gate horizontal layers, and horizontal layers disposed in the insulator stack region are insulating horizontal layers;
a memory vertical structure penetrating the gate stack region in the memory cell region;
a supporter vertical structure penetrating the gate stack region and extending into the capping insulating structure in the staircase region; and
a plurality of separation structures penetrating the gate stack region and extending into the capping insulating structure, wherein:
at least one of the separation structures includes a first side surface, a second side surface not aligned perpendicularly to the first side surface, and a connection side surface extending from the first side surface to the second side surface,
the connection side surface of the separation structures is disposed on a level higher than a level of an uppermost gate horizontal layer of the gate horizontal layers of the stack structure, and
at least a portion of the connection side surface is disposed on the same level as a level of an upper surface of the memory vertical structure.

2. The semiconductor device of claim 1, wherein at least a portion of the connection side surface is disposed on the same level as a level of an upper surface of at least one of the memory vertical structure, the supporter vertical structure, and the first dam vertical structure.

3. The semiconductor device of claim 1, wherein:
the memory vertical structure, the supporter vertical structure, and the first dam vertical structure have upper surfaces coplanar with one another, and
the at least a portion of the connection side surface and the upper surface of the memory vertical structure are disposed on the same level as a level of the upper surfaces of the supporter vertical structure and the first dam vertical structure.

4. The semiconductor device of claim 1, wherein each of the memory vertical structure, the supporter vertical structure, and the first dam vertical structure includes:
a gap-fill insulating layer;
a channel material layer covering an external surface and a bottom surface of the gap-fill insulating layer;
a first dielectric layer covering an external surface and a bottom surface of the channel material layer;
a data storage material layer covering an external surface and a bottom surface of the first dielectric layer;
a second dielectric layer covering an external surface and a bottom surface of the data storage material layer; and
a pad material layer on the gap-fill insulating layer.

5. The semiconductor device of claim 4, wherein:
the memory vertical structure further includes a void disposed in the gap-fill insulating layer of the memory vertical structure,
a first separation structure of one of the separation structures has a linear shape extending in a first horizontal direction,
the first separation structure includes a separation gap-fill material layer and a void disposed in the separation gap-fill material layer, and
a maximum width of the void of the first separation structure is greater than a maximum width of the void of the memory vertical structure.

6. The semiconductor device of claim 4, wherein:
the supporter vertical structure further includes a void disposed in the gap-fill insulating layer of the supporter vertical structure,
a first separation structure of one of the separation structures has a linear shape extending in a first horizontal direction,
the first separation structure includes a separation gap-fill material layer and a void disposed in the separation gap-fill material layer, and
a maximum width of the void of the first separation structure is greater than a maximum width of the void of the supporter vertical structure.

7. The semiconductor device of claim 4, wherein:
the first dam vertical structure further includes a void disposed in the gap-fill insulating layer of the first dam vertical structure,
a first separation structure of one of the separation structures has a linear shape extending in a first horizontal direction,
the first separation structure includes a separation gap-fill material layer and a void disposed in the separation gap-fill material layer, and
a maximum width of the void of the first separation structure is greater than a maximum width of the void of the first dam vertical structure.

8. The semiconductor device of claim 4, wherein:
the memory vertical structure further includes a void disposed in the gap-fill insulating layer of the memory vertical structure,
a first separation structure of one of the separation structures has a linear shape extending in a first horizontal direction,
the first separation structure includes a separation gap-fill material layer and a void disposed in the separation gap-fill material layer, and
a length of the void of the first separation structure in a vertical direction is greater than a length of the void of the memory vertical structure in the vertical direction.

9. The semiconductor device of claim 1, wherein:
the separation structures include main separation structures, and auxiliary separation structures disposed between the main separation structures,
at least one of the main separation structures and the auxiliary separation structures have a linear shape extending in a first horizontal direction,
each of the main separation structures has a linear shape extending in the first horizontal direction, crossing the stack structure, and dividing the stack structure in a second horizontal direction perpendicular to the first horizontal direction, and
in the staircase region, the first dam vertical structure is disposed between a pair of main separation structures adjacent to each other in the second horizontal direction among the main separation structures.

10. The semiconductor device of claim 1, further comprising:
a bit-line contact plug; and
a bit line electrically connected to the bit-line contact plug on the bit-line contact plug, wherein:
the bit-line contact plug is in contact with the memory vertical structure on the memory vertical structure and a side surface thereof is surrounded by the capping insulating structure, and
an entire upper surface of the supporter vertical structure and an entire upper surface of the first dam vertical structure are in contact with the capping insulating structure.

11. The semiconductor device of claim 1, further comprising:
through contact plugs penetrating the insulator stack region of the stack structure and extending into the capping insulating structure in the staircase region;
gate contact plugs disposed on the gate stack region of the stack structure in the staircase region and extending into the capping insulating structure; and
gate connection wirings electrically connecting the through contact plugs to the gate contact plugs, wherein:
the lower structure includes a peripheral circuit, and the through contact plugs are electrically connected to the peripheral circuit.

12. The semiconductor device of claim 1, wherein:
the stack structure includes:
a first stack structure; and
a second stack structure on the first stack structure,
the first stack structure includes first interlayer insulating layers and first horizontal layers, alternately stacked,
the second stack structure includes second interlayer insulating layers and second horizontal layers, alternately stacked,
among the first interlayer insulating layers and the first horizontal layers, an uppermost layer is a first uppermost interlayer insulating layer, and a lowermost layer is a first lowermost interlayer insulating layer, among the second interlayer insulating layers and the second horizontal layers, an uppermost layer is a second uppermost interlayer insulating layer, and a lowermost layer is a second lowermost interlayer insulating layer, the memory vertical structure includes a first memory vertical portion penetrating the first stack structure and a second memory vertical portion penetrating the second stack structure, a width of an upper region of the first memory vertical portion adjacent to the second memory vertical portion is greater than a width of a lower region of the second memory vertical portion adjacent to the first memory vertical portion, the supporter vertical structure includes a first supporter vertical portion penetrating through the first stack structure and a second supporter vertical portion penetrating at least a portion of the second stack structure and extending into the capping insulating structure, a width of an upper region of the first supporter vertical portion adjacent to the second supporter vertical portion is greater than a width of a lower region of the second supporter vertical portion adjacent to the first supporter vertical portion, the first dam vertical structure includes a first dam vertical portion penetrating the first stack structure and a second dam vertical portion penetrating at least a portion of the second stack structure and extending into the capping insulating structure, a width of an upper region of the first dam vertical portion adjacent to the second dam vertical portion is greater than a width of a lower region of the second dam vertical portion adjacent to the first dam vertical portion, at least one of the separation structures includes a first separation vertical portion penetrating the first stack structure, a second separation vertical portion penetrating at least a portion of the second stack structure and extending into the capping insulating structure, and an upper vertical portion on the second separation vertical portion, a width of an upper region of the first separation vertical portion adjacent to the second separation vertical portion is greater than a width of a lower region of the second separation vertical portion adjacent to the first separation vertical portion, and a width of an upper region of the second separation vertical portion adjacent to the upper vertical portion is greater than a width of a lower region of the upper vertical portion adjacent to the second separation vertical portion.

13. The semiconductor device of claim 12, further comprising:

a second dam vertical structure spaced apart from the first dam vertical structure and distanced further from the memory cell region than the first dam vertical structure in the staircase region, wherein the second dam vertical structure includes a material the same as a material of the first dam vertical structure.

14. The semiconductor device of claim 12, further comprising:

a pattern structure disposed between the stack structure and the lower structure, wherein the pattern structure includes:

a lower pattern layer;

a first intermediate pattern layer on the lower pattern layer;

a second intermediate pattern layer spaced apart from the first intermediate pattern layer on the lower pattern layer; and an upper pattern layer covering the first and second intermediate pattern layers on the lower pattern layer, wherein:

the lower pattern layer includes a first silicon layer, the first intermediate pattern layer includes a second silicon layer, the upper pattern layer includes a third silicon layer, the second intermediate pattern layer includes a dielectric material layer, each of the memory vertical structure, the supporter vertical structure, and the first dam vertical structure includes:

a gap-fill insulating layer;

a channel material layer covering an external surface and a bottom surface of the gap-fill insulating layer;

a data storage structure covering an external surface and a bottom surface of the channel material layer; and a pad material layer on the gap-fill insulating layer, the memory vertical structure penetrates the upper pattern layer and the first intermediate pattern layer and extends into the lower pattern layer, the first intermediate pattern layer penetrates the data storage structure of the memory vertical structure and in contact with the channel material layer of the memory vertical structure, the supporter vertical structure and the first dam vertical structure penetrate the upper pattern layer and the second intermediate pattern layer and extend into the lower pattern layer, and the second intermediate pattern layer is spaced apart from the supporter vertical structure and the channel material layer of the first dam vertical structure.

15. A semiconductor device comprising:

a lower structure;

a stack structure including interlayer insulating layers and horizontal layers alternately stacked on the lower structure, wherein the stack structure is disposed in a memory cell region and a staircase region adjacent to the memory cell region, the stack structure has a staircase shape in the staircase region, and the stack structure includes a gate stack region and an insulator stack region;

a capping insulating structure covering the stack structure on the lower structure;

a memory vertical structure penetrating the gate stack region in the memory cell region;

a supporter vertical structure penetrating the gate stack region and extending into the capping insulating structure in the staircase region;

a dam vertical structure penetrating a region between the gate stack region and the insulator stack region of the stack structure; and a plurality of separation structures penetrating the gate stack region and extending into the capping insulating structure, wherein:

the memory vertical structure, the supporter vertical structure, and the dam vertical structure have upper surfaces coplanar with one another, the separation structures include a first separation structure, the first separation structure includes a separation gap-fill material layer and a void in the separation gap-fill material layer, each of the memory vertical structure, the supporter vertical structure, and the dam vertical structure includes:
a gap-fill insulating layer;
a channel material layer covering an external surface and a bottom surface of the gap-fill insulating layer;
a first dielectric layer covering an external surface and a bottom surface of the channel material layer;
a data storage material layer covering an external surface and a bottom surface of the first dielectric layer;
a second dielectric layer covering an external surface and a bottom surface of the data storage material layer; and
a pad material layer on the gap-fill insulating layer,
at least one of the memory vertical structure, the supporter vertical structure, and the dam vertical structure includes a void, and
a maximum width of the void in the separation gap-fill material layer is greater than a maximum width of the void of the gap-fill insulating layer of at least one of the memory vertical structure, the supporter vertical structure, and the dam vertical structure.

16. The semiconductor device of claim 15, wherein a length of the void in the separation gap-fill material layer in a vertical direction is greater than a length of the void in the gap-fill insulating layer of at least one of the memory vertical structure, the supporter vertical structure, and the dam vertical structure in the vertical direction.

17. The semiconductor device of claim 16, further comprising:
a through contact plug penetrating the insulator stack region, wherein:
on a plane, the dam vertical structure has a quadrangular ring shape or a ring shape similar to a quadrangle including first linear portions parallel to each other and second linear portions parallel to each other,
the stack structure includes interlayer insulating layers and horizontal layers, alternately stacked,
among the horizontal layers, horizontal layers disposed in the gate stack region are gate horizontal layers, and horizontal layers disposed in the insulator stack region are insulating horizontal layers,
the lower structure includes a peripheral circuit,
the through contact plug is electrically connected to the peripheral circuit, and
each of the first and second linear portions has a width greater than a width of the memory vertical structure.

18. The semiconductor device of claim 15, further comprising:
a pattern structure disposed between the stack structure and the lower structure, wherein the pattern structure includes:
a lower pattern layer;
a first intermediate pattern layer on the lower pattern layer;
a second intermediate pattern layer spaced apart from the first intermediate pattern layer on the lower pattern layer; and
an upper pattern layer covering the first and second intermediate pattern layers on the lower pattern layer, wherein:
the lower pattern layer includes a first silicon layer,
the first intermediate pattern layer includes a second silicon layer,
the upper pattern layer includes a third silicon layer,
the second intermediate pattern layer includes a dielectric material layer,
the memory vertical structure penetrates the upper pattern layer and the first intermediate pattern layer and extends into the lower pattern layer,
the first intermediate pattern layer penetrates the data storage material layer of the memory vertical structure and in contact with the channel material layer of the memory vertical structure,
the supporter vertical structure and the dam vertical structure penetrate the upper pattern layer and the second intermediate pattern layer and extend into the lower pattern layer, and
the second intermediate pattern layer is spaced apart from the supporter vertical structure and the channel material layer of the dam vertical structure.

19. A data storage system comprising:
a main substrate;
a semiconductor device on the main substrate; and
a controller electrically connected to the semiconductor device on the main substrate, wherein the semiconductor device includes:
a lower structure including a peripheral circuit;
a stack structure including interlayer insulating layers and horizontal layers alternately stacked on the lower structure, wherein the stack structure is disposed in a memory cell region and a staircase region adjacent to the memory cell region, and the stack structure has a staircase shape in the staircase region;
a capping insulating structure covering the stack structure on the lower structure;
a dam vertical structure penetrating the stack structure in the staircase region and extending into the capping insulating structure, wherein the dam vertical structure divides the stack structure into a gate stack region and an insulator stack region, and among the horizontal layers, horizontal layers disposed in the gate stack region are gate horizontal layers, and horizontal layers disposed in the insulator stack region are insulating horizontal layers;
a memory vertical structure penetrating the gate stack region in the memory cell region;
a supporter vertical structure penetrating the gate stack region and extending into the capping insulating structure in the staircase region; and
a plurality of separation structures penetrating the gate stack region and extending into the capping insulating structure, wherein:
at least one of the separation structures includes a first side surface, a second side surface not aligned perpendicularly to the first side surface, and a connection side surface extending from the first side surface to the second side surface,
the connection side surface of the separation structures is disposed on a level higher than a level of an uppermost gate horizontal layer of the gate horizontal layers of the stack structure, and
at least a portion of the connection side surface is disposed on the same level as a level of an upper surface of the memory vertical structure.

20. The semiconductor device of claim 19, wherein:
the memory vertical structure, the supporter vertical structure, and the dam vertical structure have upper surfaces coplanar with one another,
the at least a portion of the connection side surface and the upper surface of the memory vertical structure are disposed on the same level as a level of the upper surfaces the supporter vertical structure and the dam vertical structure, each of the memory vertical structure, the supporter vertical structure, and the dam vertical structure includes:

a gap-fill insulating layer;

a channel material layer covering an external surface and a bottom surface of the gap-fill insulating layer;

a first dielectric layer covering an external surface and a bottom surface of the channel material layer;

a data storage material layer covering an external surface and a bottom surface of the first dielectric layer;

a second dielectric layer covering an external surface and a bottom surface of the data storage material layer; and a pad material layer on the gap-fill insulating layer, the separation structures include a first separation structure, the first separation structure includes a separation gap-fill material layer and a void disposed in the separation gap-fill material layer, at least one of the memory vertical structure, the supporter vertical structure, and the dam vertical structure includes a void, and a maximum width of the void in the separation gap-fill material layer is greater than a maximum width of the void of the gap-fill insulating layer of at least one of the memory vertical structure, the supporter vertical structure, and the dam vertical structure.

* * * * *